US009076537B2

(12) United States Patent
Khvalkovskiy et al.

(10) Patent No.: US 9,076,537 B2
(45) Date of Patent: Jul. 7, 2015

(54) METHOD AND SYSTEM FOR PROVIDING A MAGNETIC TUNNELING JUNCTION USING SPIN-ORBIT INTERACTION BASED SWITCHING AND MEMORIES UTILIZING THE MAGNETIC TUNNELING JUNCTION

(75) Inventors: Alexey Vasilyevitch Khvalkovskiy, Milpitas, CA (US); Dmytro Apalkov, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 244 days.

(21) Appl. No.: 13/594,824

(22) Filed: Aug. 26, 2012

(65) Prior Publication Data
US 2014/0056060 A1 Feb. 27, 2014

(51) Int. Cl.
| G11C 11/00 | (2006.01) |
| G11C 11/16 | (2006.01) |
| H01L 43/02 | (2006.01) |
| H01L 43/08 | (2006.01) |
| H01L 27/22 | (2006.01) |
| G11C 11/18 | (2006.01) |

(52) U.S. Cl.
CPC ........... *G11C 11/16* (2013.01); *H01L 43/02* (2013.01); *H01L 43/08* (2013.01); *H01L 27/228* (2013.01); *G11C 11/18* (2013.01)

(58) Field of Classification Search
CPC ....... H01L 27/228; H01L 43/12; G11C 11/16
USPC ........................................................ 365/158
See application file for complete search history.

(56) References Cited

U.S. PATENT DOCUMENTS

| 7,307,299 | B2 | 12/2007 | Koo et al. |
| 7,430,135 | B2 | 9/2008 | Huai et al. |
| 7,649,719 | B2 | 1/2010 | Carey et al. |
| 7,839,675 | B2 * | 11/2010 | Koo et al. .................. 365/170 |
| 7,939,870 | B2 | 5/2011 | Wunderlich et al. |
| 7,994,555 | B2 | 8/2011 | Koo et al. |

(Continued)

FOREIGN PATENT DOCUMENTS

| JP | 11144927 | 5/1999 |
| JP | 2009239135 | 10/2009 |
| JP | 2012038929 | 2/2012 |

OTHER PUBLICATIONS

Lugiao Liu, et al., Science Mag, vol. 336, "Spin-Torque Switching with the Giant Spin Hall Effect of Tantalum," pp. 555-558, May 4, 2012.

(Continued)

*Primary Examiner* — Hoai V Ho
*Assistant Examiner* — Pablo Huerta
(74) *Attorney, Agent, or Firm* — Convergent Law Group LLP

(57) ABSTRACT

A magnetic memory is described. The magnetic memory includes magnetic junctions and at least one spin-orbit interaction (SO) active layer. Each of the magnetic junctions includes a data storage layer that is magnetic. The SO active layer(s) are adjacent to the data storage layer of the magnetic junction. The at SO active layer(s) are configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer. The data storage layer is configured to be switchable using at least the SO torque.

43 Claims, 10 Drawing Sheets

(56) References Cited

U.S. PATENT DOCUMENTS

| | | |
|---|---|---|
| 8,125,247 B2 | 2/2012 | Koo et al. |
| 8,264,018 B2 * | 9/2012 | Yoon et al. .................... 257/278 |
| 2007/0171694 A1 * | 7/2007 | Huai et al. .................... 365/145 |
| 2009/0161265 A1 | 6/2009 | Sugano et al. |
| 2011/0044099 A1 * | 2/2011 | Dieny ........................... 365/171 |
| 2011/0075476 A1 | 3/2011 | Kajiwara et al. |
| 2011/0293967 A1 * | 12/2011 | Zhang et al. ................. 428/827 |
| 2012/0058575 A1 * | 3/2012 | Horng et al. ...................... 438/3 |
| 2012/0176154 A1 * | 7/2012 | Behin-Aein et al. ............ 326/37 |
| 2013/0100724 A1 * | 4/2013 | Venkataraman et al. ..... 365/145 |
| 2013/0307097 A1 * | 11/2013 | Yi et al. ......................... 257/421 |
| 2014/0017820 A1 * | 1/2014 | Jan et al. ............................ 438/3 |
| 2014/0063921 A1 * | 3/2014 | Tang et al. .................... 365/158 |

OTHER PUBLICATIONS

AAAS, Science vol. 336, No. 6081, Liu et al., "Spin-Torque Switching with the Giant Spin Hall Effect Tantalum," pp. 555-558, May 4, 2012.

* cited by examiner

METHOD AND SYSTEM FOR PROVIDING A MAGNETIC TUNNELING JUNCTION USING SPIN-ORBIT INTERACTION BASED SWITCHING AND MEMORIES UTILIZING THE MAGNETIC TUNNELING JUNCTION

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned, or reference layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional reference layer 16 is fixed, or pinned, in a particular direction, typically by an exchange-bias interaction with the AFM layer 14. Although depicted as a simple (single) layer, the conventional reference layer 16 may include multiple layers. For example, the conventional reference layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Similarly, the magnetization 17 of the conventional pinned layer 16 may also be perpendicular to the plane.

To switch the magnetization 21 of the conventional free layer 20, a current is driven perpendicular to plane (in the z-direction). The current carriers are spin polarized and exert a torque on the magnetization 21 of the conventional free layer. The spin transfer torque on the magnetic moment 21 of the conventional free layer 20 is initially small when the magnetic moment 21 is parallel to the easy axis (the stable state). As such, the stable state of the magnetic moment 21 also corresponds to a stagnation point in switching. Due to thermal fluctuations, the magnetic moment 21 may rotate from alignment with the easy axis of the conventional free layer 20. The spin transfer torque may then act to increasing effect, and the magnetic moment of the free layer 20 switched. When a sufficient current is driven from the top contact 24 to the bottom contact 11, the magnetization 21 of the conventional free layer 20 may switch to be parallel to the magnetization 17 of the conventional reference layer 16. When a sufficient current is driven from the bottom contact 11 to the top contact 24, the magnetization 21 of the free layer may switch to be antiparallel to that of the reference layer 16. The differences in magnetic configurations correspond to different magnetoresistances and thus different logical states (e.g. a logical "0" and a logical "1") of the conventional MTJ 10.

When used in STT-RAM applications, the free layer 20 of the conventional MTJ 10 is desired to be switched at a relatively low current in order to prevent damage to the conventional magnetic junction 10, reduce the size of the transistor which supplies this current (not shown) and reduce energy consumption for the memory operation. In addition, a short current pulse is desired to be used in programming the conventional magnetic element 10 at higher data rates. For example, current pulses on the order of 20-30 ns or less are desired to allow the magnetization of the conventional free layer 20 to switch faster.

Although the conventional MTJ 10 may be written using spin transfer and used in an STT-RAM, there are drawbacks. For example, the write error rates may be higher than desired for memories having an acceptable pulse width. The write error rate (WER) is the probability that a cell (i.e. the magnetization 21 of free layer 20 of the conventional magnetic junction) is not switched when subjected to a current that is at least equal to the typical switching current. The WER is desired to be $10^{-9}$ or less. However, very high currents can be required to achieve switching of the conventional free layer 20 at this WER value. In addition, it has been determined that the WER may be challenging to improve for shorter write current pulses. For example, FIG. 2 is a graph 50 depicts trends in WERs for pulses of different widths. Note that actual data are not plotted in the graph 50. Instead, the graph 50 is meant to indicate trends. The pulse width, from longest to shortest, is for curves 52, 54, 56, and 58. As can be seen in the graph 50, for higher pulse widths, the WER versus voltage applied to the junction 10 has a higher slope. Thus, application of a higher voltage for the same pulse width may bring about a significant reduction in the WER. However, as the pulse widths shorten in curves 54, 56, and 58, the slope of the curves 54, 56, and 58 decreases. For a decreasing pulse width, an increase in voltage and/or current is less likely to bring about a reduction in the WER. At sufficiently short pulses, even high voltages/currents do not result in a lower error rate. Consequently, memories employing the conventional MTJ 10 may have unacceptably high WER that may not be cured by an increase in voltage.

Furthermore, although a single magnetic tunneling junction is shown in FIG. 1, dual magnetic tunneling junctions are often used to obtain a sufficiently high spin transfer torque for switching. The dual magnetic tunneling junction has a single free layer sandwiched by two tunneling barrier layers. Each tunneling barrier layer is between the free layer and a reference layer. The second (upper) tunneling barrier of a dual magnetic tunneling junction may be challenging to grow with a suitable crystal structure. Further, to obtain such a high torque the reference layers have their magnetic moments fixed in opposite directions. As a result, there is cancellation of magnetoresistance, which lowers the read signal. Such a reduction in signal is undesirable.

Accordingly, what is needed is a method and system that may improve the performance of the spin transfer torque based memories. The method and system described herein address such a need.

BRIEF SUMMARY OF THE INVENTION

A magnetic memory is described. The magnetic memory includes magnetic junctions and at least one spin-orbit interaction (SO) active layer. Each of the magnetic junctions includes a data storage layer that is magnetic. The SO active layer(s) are adjacent to the data storage layer of the magnetic junction. The at SO active layer(s) are configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer. The data storage layer is configured to be switchable using at least the SO torque.

DETAILED DESCRIPTION OF THE INVENTION

Figure 1:
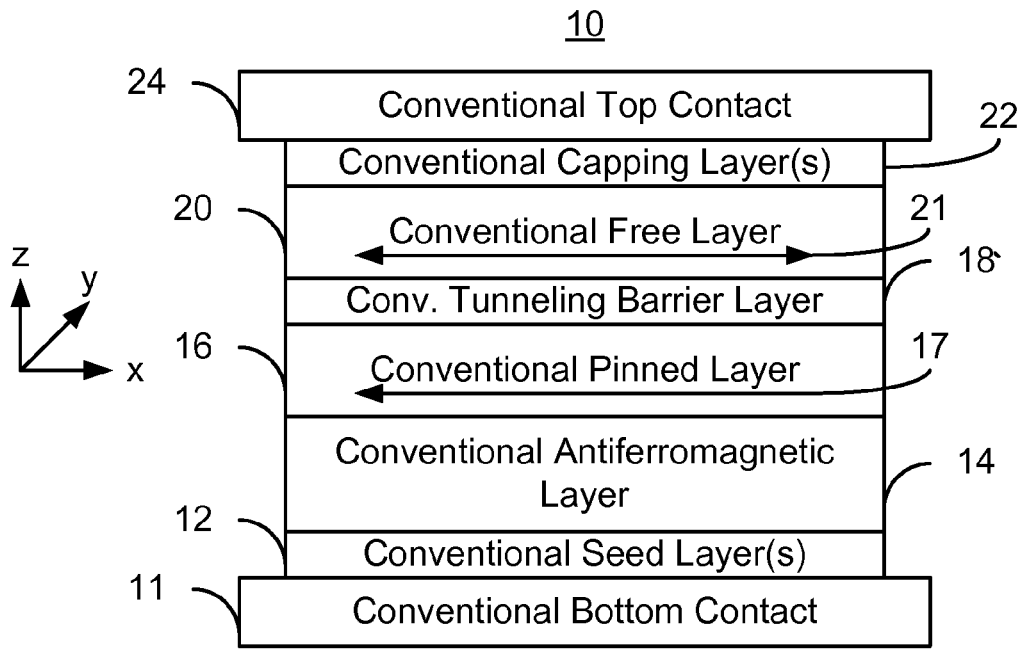
FIG. 1 depicts a conventional magnetic junction.
Figure 2:
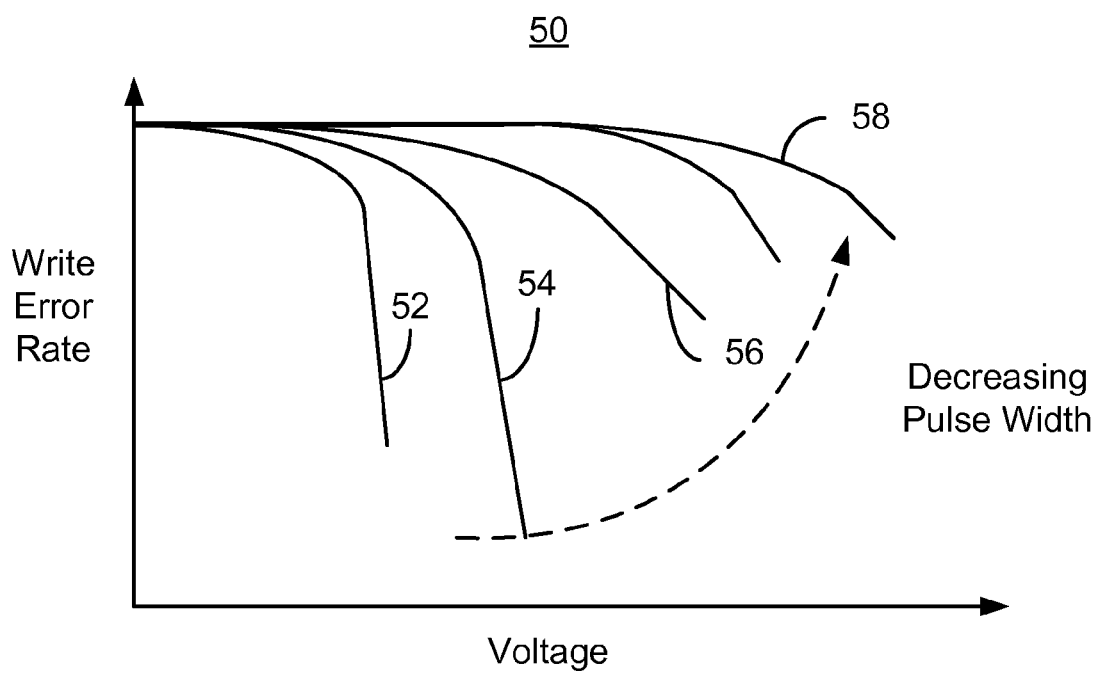
FIG. 2 depicts write error rate versus voltage for a conventional spin transfer torque RAM.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments describe methods and systems for providing a magnetic memory utilizing the magnetic junction switched via spin-orbit interaction as well as method(s) for programming the magnetic memory. The magnetic memory includes magnetic junctions and at least one spin-orbit (SO) active layer. Each of the magnetic junctions includes a data storage layer that is magnetic. The SO active layer(s) are adjacent to the data storage layer of the magnetic junction. The at SO active layer(s) are configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer. The data storage layer is configured to be switchable using at least the SO torque.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of spin-orbit interaction, the spin transfer phenomenon, of magnetic anisotropy, and other physical phenomenon. Consequently, one of ordinary skill in the art will readily recognize that theoretical explanations of the behavior of the method and system are made based upon this current understanding of spin-orbit interaction, spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions, spin-orbit active layers, and/or other structures having particular layers. However, one of ordinary skill in the art will readily recognize that magnetic junctions, spin-orbit active layers, and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3:
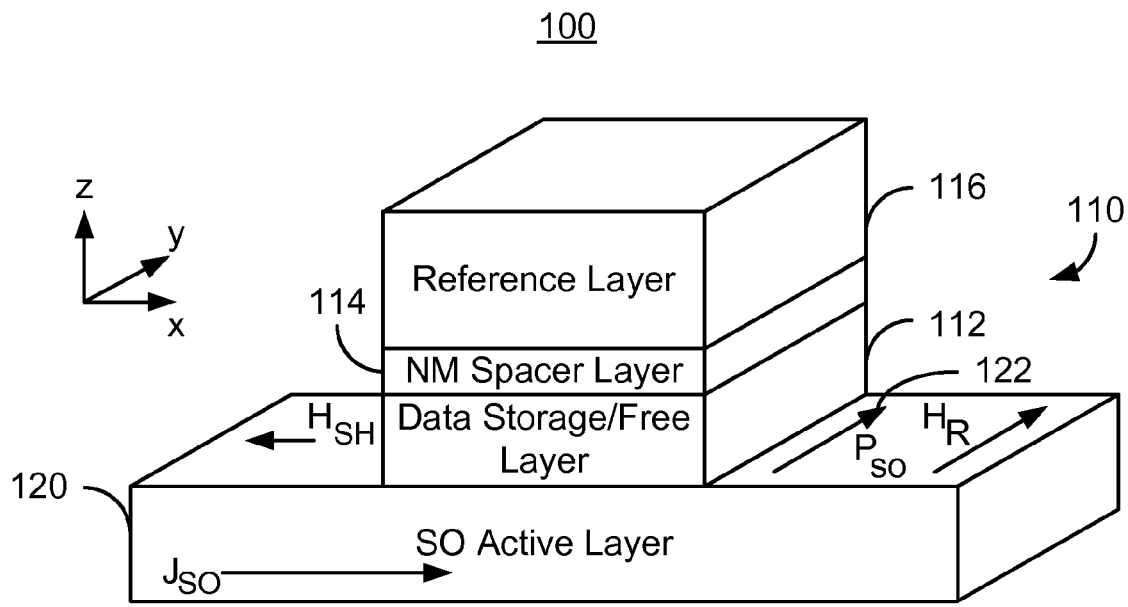
FIG. 3 depicts an exemplary embodiment of a magnetic junction switched using spin-orbit interaction.

FIG. 3 depicts an exemplary embodiment of a portion of a magnetic memory 100 that utilizes spin-orbit interaction in switching. For clarity, FIG. 3 is not to scale. In addition, portions of the magnetic memory 100 such as bit lines, row and column selectors, and selection devices such as transistors for each cell are not shown. The magnetic memory 100 includes a magnetic junction 110 and a spin-orbit interaction (SO) active layer 120. The magnetic junction 110 may be part of a memory cell that may also include selection device(s) such as transistor(s) and/or other magnetic junctions.

In the embodiment shown, the magnetic junction 110 includes a data storage layer 112, a nonmagnetic spacer layer 114, and a reference layer 116. The spacer layer 114 is nonmagnetic. In some embodiments, each spacer layer 114 is an insulator, for example a tunneling barrier. In such embodiments, each spacer layer 114 may include crystalline MgO, which may enhance the TMR and spin transfer efficiency of and/or the spin-orbit interaction for the magnetic junction 110. In other embodiments, the spacer layer 114 may be a conductor, such as Cu. In alternate embodiments, the spacer layer 114 might have another structure, for example a granular layer including conductive channels in an insulating matrix.

The data storage layer 112 is a free layer 112 having a magnetic moment (not shown) that is switchable. When the magnetic junction 110 is quiescent (not being switched), the magnetic moment of the free layer 112 lies along the easy axis of the free layer 112. The magnetic moment of the reference layer 112 is desired to be substantially fixed in place during operation of the magnetic memory 100. The reference layer 116 is depicted as a single layer. However, in other embodiments, the reference layer 116 may be a multilayer including, but not limited to a synthetic antiferromagnet having ferromagnetic layers separated by nonmagnetic layer(s) that may be Ru. In some embodiments, the magnetic junction 110 also includes a pinning layer, such as an antiferromagnetic layer (not shown) that fixes the magnetic moment of the reference layer 116 in place. In other embodiments, the magnetic moment of the reference layer 116 is fixed in another manner. The free and reference layers 112 and 116 are ferromagnetic and thus may include one or more of Fe, Ni, and Co. Although magnetic moments are not shown, the magnetic moments of the layers 112 and 116 may be perpendicular to plane in some embodiments. Thus, each of the layers 112 and/or 116 may have a perpendicular anisotropy field that exceeds its out-of-plane demagnetization field (typically a significant fraction of $4\pi M_s$). In other embodiments, the magnetic moments are in plane.

The magnetic moment of the free layer 112 is switched using the spin-orbit interaction effect, described below. In some embodiments, the free layer 112 magnetic moment is switched using only the spin-orbit interaction effect. However, in other embodiments, the free layer 112 may be switched using a combination of effects. For example, the magnetic moment of the free layer 112 may be switched using spin transfer torque as a primary effect that may be assisted by torque induced by the spin-orbit interaction. However, in other embodiments, the primary switching mechanism is torque induced by the spin-orbit interaction. In such embodiments, another effect including but not limited to spin transfer torque, may assist in switching and/or selecting the magnetic junction 110.

The SO active layer 120 is a layer that has a strong spin-orbit interaction and that can be used in switching the magnetic moment of the free layer 112. The SO active layer 120 may be used in generating a spin-orbit field $H_{SO}$. More specifically, a current driven in plane through the SO active layer 120 and the attendant spin-orbit interaction may result in the spin-orbit field $H_{SO}$. This spin orbit field $H_{SO}$ is equivalent, to the spin-orbit torque, $T_{SO}$, on magnetization $T_{SO}=-\gamma[M\times H_{SO}]$ in the free layer 112. This mutually correlated torque and field are thus interchangeably referred to as spin-orbit field and spin-orbit torque. This reflects the fact that the spin-orbit interaction is the origin of the spin-orbit torque and spin-orbit field. This terminology also differentiates this spin-orbit (SO) torque from the more conventional spin-transfer torque (STT). Spin-orbit torque occurs for a current driven in plane in the SO active layer 120 and a spin-orbit interaction. In contrast, spin transfer torque is due to a perpendicular-to-plane current flowing through the free layer 112, spacer layer 114 and reference layer 116, that injects spin polarized charge carriers into the free layer 112. The spin-orbit torque $T_{SO}$ may rapidly deflect the magnetic moment of the free layer 112 from its equilibrium state parallel to the easy axis. The spin-orbit torque $T_{SO}$ may tilt the magnetization of the free layer considerably faster than conventional STT torque of similar maximum amplitude. In some embodiments, switching can be completed using spin-orbit torque. In other embodiments, another mechanism such as spin transfer may be used to complete switching. The spin-orbit field/spin-orbit torque generated may thus be used in switching the magnetic moment of the free layer 112.

In some embodiments, the SO interaction may include some combination of two effects: the spin Hall effect and the Rashba effect. In many SO active layers, the spin-orbit interaction includes both the spin Hall effect and the Rashba effect, but one of the two dominates. Consequently, the spin Hall effect and the Rashba effect are described below. The spin Hall effect is generally considered to be a bulk effect. Materials that exhibit the spin Hall effect often include heavy metals or materials doped by heavy metals. For example, such materials can be selected from A and M doped by B. A includes Y, Zr, Nb, Mo, Tc, Ru, Rh, Pd, Cd, In, Sb, Te, Hf, Ta (including high-resistive amorphous β-Ta), W, Re, Os, Ir, Pt, Au, Hg, Tl, Pb, Bi, Po, At, and/or their combinations; M includes at least one of Al, Ti, V, Cr, Mn, Cu, Zn, Ag, Hf, Ta, W, Re, Pt, Au, Hg, Pb, Si, Ga, GaMn or GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb. In some embodiments, the SO active layer 120 may include or consist of Ir doped Cu and/or Bi doped Cu. The doping is generally in the range of 0.1 through 10 atomic percent. In other embodiments, other materials may be used.

For the spin Hall effect, a current, $J_{SO}$, is driven in the plane of the SO active layer 120 (i.e. current-in-plane, substantially in the x-y plane in FIG. 3). Stated differently, the current is driven perpendicular to the direction between the SO active layer 120 and the data storage/free layer 112 (i.e. perpendicular to the normal to the surface, perpendicular to the z-direction in FIG. 3). Charge carriers having spins of a particular orientation perpendicular to the direction of current and to the normal to the surface (z-direction) accumulate at the surfaces of the SO active layer 120. In the embodiment shown in FIG. 3, the charge carriers having spins in the y-direction accumulate at the top of the SO active layer 120, which is shown by unit polarization vector $p_{SO}$ 122. Many of these spin-polarized carriers diffuse into the free layer. This diffusion results in the torque $T_{SO}$ on the magnetization of the free layer 112. Since torque on the magnetization is equivalent to the effective field on the magnetization, through $T_{SO} = -\gamma[M \times H_{SO}]$, it can be equivalently stated that the spin accumulation results in the field $H_{SO}$ on the free layer 112. The spin-orbit field for the spin-Hall effect is the cross product of the spin-orbit polarization 122 and the magnetic moment of the free layer 112 and is given by:

$$H_{SO} \alpha (J_{SO} * P_{SO}/2t*e) m \times p_{SO}$$

Here t is the thickness of the free layer 112, e is the electron charge, m is the unit vector long the magnetization of the data storage layer 112 and $p_{SO}$ is the unit vector along in the direction of the spin polarization 122. As such, the magnitude of the torque is proportional to in plane current density $J_{SO}$ and spin polarization of the carriers $P_{SO}$. For some embodiments in which the spin-Hall effect is the only SO interaction, $P_{SO}$ is equal to so-called the Hall angle $\Phi_{SO}$. In general, $P_{SO}$ is a characteristic of the geometry and the material(s) used for the SO active layer 120 and for the adjacent layers. For various materials, the $P_{SO}$ may be 0.01-1. Larger values of the SO polarization $P_{SO}$ result in larger polarizations and, therefore, larger spin-orbit fields and torques.

The spin-Hall effect may be used in switching the magnetic junction 110 when the polarization induced by the spin-Hall effect $p_{SO}$ is parallel to the easy axis of the free layer 112. To obtain the spin-orbit torque $T_{SO}$, the current pulse is driven in plane through the SO active layer 120. The resulting spin-orbit torque $T_{SO}$ counteracts damping torque, which results in the switching of the magnetization of the free layer 112 in an analogous manner to conventional STT switching.

Another source of the spin-orbit field $H_{SO}$ in the SO active layer 120 can be related to the spin-orbit interaction at the interfaces. The magnitude of the spin-orbit field in this case is often related to the magnitude of the crystal field, which is often high at the interface. Due to the mismatch of the lattice parameters of the adjacent layers, the presence of heavy metals at the interface, and other effects, the spin-orbit interaction can be considerably large at some interfaces. A strong spin-orbit effect at the interface associated with the gradient of the crystal field in the perpendicular to the interface plane direction is often referred to as the Rashba effect. As used herein, however, the Rashba effect refers to a spin-orbit interaction at the interface regardless of its origin and direction. Note that in at least some embodiments, the interfaces for the SO active layer 120 should differ to get a sizable Rashba affect. For example, the Rashba effect may occur for the SO active layer 120 being/having a Pt layer adjoining the magnetic junction 110, a Co layer for the free layer 112, and an aluminum oxide or MgO nonmagnetic layer 114. In some embodiments, other materials may be used.

The effect of the spin-orbit interaction at the interface (i.e. the Rashba effect) on the magnetization is twofold. First, the spin accumulation can build up at the interface. The unit vector of spin-polarization of this spin accumulation $p_{SO}$ for the Rashba effect is typically perpendicular to the crystal field and the current direction. Many SO active layers 120 have a crystal field perpendicular to the plane of the layer 120. As such, the spin-orbit polarization $p_{SO}$ 122 would be in plane as shown in FIG. 3. Alternatively, the SO active layer 120 may have a crystalline field in plane or tilted to the plane. As such, the SO active layer 120 has a spin-orbit polarization perpendicular to plane (not shown in FIG. 3) or correspondingly tilted to the plane (not shown in FIG. 3). In such embodiments, the SO active layer 120 may be a surface alloy. For example the SO active layer 120 may include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and/or their combinations. In other embodiments, the SO active layer 120 may include surface alloys of A/B, e.g. atoms of A residing on a (111) surface of a host material B such that on the top atomic layers are a mixture of A and B. A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and B includes at least one of Si, Zn, Cu, Ag, Au, W, Zn, Cr, Pt, Pd. In many embodiments, A includes two or three different materials. In some embodiments, at least 0.1 to not more than three monolayers of A are deposited. In some such embodiments approximately ⅓ of a monolayer of A is deposited. In some embodiments, this can be one or more of substitutional Bi/Ag, substitutional Pb/Ag, substitutional Sb/Ag, substitutional Bi/Si, substitutional Ag/Pt, substitutional Pb/Ge, substitutional Bi/Cu, and a bilayer including a layer residing on a (111) surface of Au, Ag, Cu or Si. In other embodiments, the SO active layer 120 may include compounds like InGaAs, HgCdTe or bilayers $LaAlO_3/SrTiO_3$, $LaTiO_3/SrTiO_3$. In other embodiments, other materials may be used. For some embodiments, Rashba effect would result in the spin-orbit torque $T_{SO}$ and corresponding spin-orbit field $H_{SO}$ on the free layer, which are given by Expression in paragraph [039]. Here the unit polarization vector $p_{SO}$ can be in-plane, tilted or perpendicular to the plane as explained above. Polarization $P_{SO}$ for the Rashba effect for some embodiments may be 0.1-1; for some other embodiments it can be more than 1. Larger values of the polarization $P_{SO}$ result in larger polarizations and, therefore, larger spin-orbit fields. In other embodiments, Rashba effect can result in the spin-orbit field on the magnetization of the free layer which is given by:

$$H_{SO} \alpha (J_{SO} * P_{SO}/2d*e) p_{SO}$$

For the Rashba effect, the magnitude of the spin orbit torque due to the spin orbit field is proportional to the in-plane current density $J_{SO}$ and the polarization $P_{SO}$. $J_{SO}$ is thus perpendicular to the direction between the SO active layer 120 and free layer 112 (i.e. in the x-y plane and perpendicular to the normal to the surface). Again, $p_{SO}$ is the unit vector in the direction of the spin-orbit polarization. The spin-orbit polarization $P_{SO}$ for these embodiments is a characteristic of the material(s) used for the SO active layer 120. The polarization $P_{SO}$ for the Rashba effect for some embodiments may be 0.1-1. For some other embodiments the polarization can be more than 1. Larger values of the polarization $P_{SO}$ result in larger polarizations and, therefore, larger spin-orbit fields. For other embodiments, the spin-orbit field $H_{SO}$ due to the Rashba effect can be given by a combination of two terms, one given by equation in paragraphs [042] and another in [046]. The contribution of each of the terms depends on the material and geometrical properties of the interface.

If the unit polarization vector $p_{SO}$ due to the Rashba effect is parallel to the easy axis of the free layer 112, then the Rashba effect may be used in switching of the magnetic junction 110, similarly to what is described for the spin Hall effect. To switch the free layer 112, therefore, an in-plane current pulse ($J_{SO}$) is driven through the SO active layer 120. The current pulse generates the spin-orbit field $H_{SO}$ in the manner described above. The torque, corresponding to the component of the SO field given by Eq. in paragraph [042], would oppose the magnetic damping torque, and can switch magnetization of the free layer in an analogous manner to STT and similarly to what is discussed above for the spin-Hall effect. The component of the SO field given by the Eq. in paragraph [046] opposes the intrinsic anisotropy field of the free layer Hk. If $H_{SO}$ overcomes $H_K$, the magnetization also switches. If both components of the spin-orbit field are present, two effects can help each other. Note that in former case ($T_{SO}$ is overcoming the damping term), spin orbit field $H_{SO}$ typically can be 1/a times smaller than what is required for the latter case ($H_{SO}$ overcoming the anisotropy field Hk), where $\alpha$ is the Gilbert damping constant of the free layer, typically 0.001-0.05.

Thus, the magnetic memory 100 may use spin-orbit interaction and the spin-orbit field generated by the SO layer 120 in switching of the magnetic moment of the free layer 112. In some embodiments, the SO active layer 120 may rely one or both of the spin-Hall effect and the Rashba effect to generate the spin-orbit field $H_{SO}$. Consequently, as used herein, terms such as the "spin-orbit effect", spin-orbit field and/or "spin-orbit interactions" may include spin orbit coupling via the Rashba effect, the spin Hall effect, some combination of the two effects, and/or some other spin-orbit interaction or spin-orbit interaction-like effect. The spin-orbit fields can exert a torque on the magnetic moment of the data storage/free layer 112. This spin-orbit torque can be used in switching the magnetic moment of the free layer 112. In some embodiments, the spin-orbit field assists in switching the magnetic moment of the free layer 112. Another mechanism, such as spin transfer torque, is the primary switching mechanism. In other embodiments, the spin-orbit torque is the primary switching mechanism for the magnetic moment of the free layer 112. However, in some such embodiments, the spin-orbit torque may be assisted by another mechanism such as spin transfer torque. The assistance may be in switching the magnetic moment of the free layer 112 and/or in selecting the magnetic junction to be switched.

Because the spin-orbit torque may be used in switching the magnetic moment of the free layer 112, performance of the memory 100 may be improved. As discussed above, the spin-orbit torque generated by the SO active layer 120 may reduce the switching time of the magnetic junction 110. The spin-orbit torque typically has a high efficiency $P_{SO}$ and is proportional to the current $J_{SO}$. Because this current density is in plane and does not flow through the spacer layer 114, this spin-orbit current may be increased without damage to the magnetic junction 110. As a result, the spin-orbit field and spin-orbit torque may be increased. Thus, the write time may be reduced and the write error rate improved. Thus performance of the memory 100 may be improved.

Figure 4:
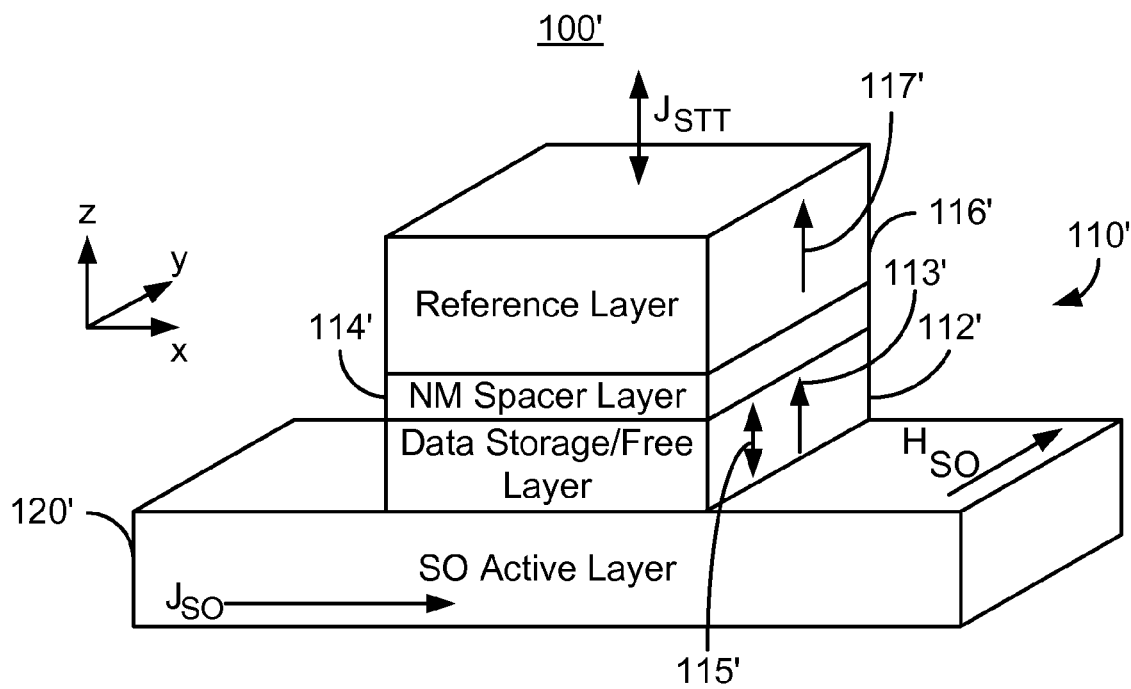
FIG. 4 depicts an exemplary embodiment of another magnetic junction switched using spin-orbit interaction.

FIG. 4 depicts an exemplary embodiment of a magnetic memory 100'. For clarity, FIG. 4 is not to scale. The magnetic memory 100' is analogous to the magnetic memory 100. Consequently, similar components have analogous labels. The magnetic memory 100' thus includes a magnetic junction 110' and a SO active layer 120' that are analogous to the magnetic junction 110 and the SO active layer 120, respectively. The magnetic junction 110' includes a data storage/free layer 112', a nonmagnetic spacer layer 114', and a reference layer 116' that are analogous to the storage/free layer 112, the nonmagnetic spacer layer 114, and the reference layer 116, respectively. Thus, the structure and function of the components 110' and 120' are analogous to that described above for the components 110 and 120, respectively. The magnetic moment 113' of the free layer 112' is stable perpendicular to plane. The magnetic moment 113' is thus parallel to the easy axis 115' of the free layer 112'. In the embodiment shown, the magnetic moment 117' of the reference layer 116' is also perpendicular to plane.

The primary switching mechanism for the magnetic junction 110' is spin transfer torque. Thus, a switching current, $J_{STT}$, driven perpendicular to plane (along the z axis) through the magnetic junction 110' is the primary switching current. However, spin-orbit interaction torque is used in assisting switching. The in-plane spin-orbit current, $J_{SO}$, is thus driven through the SO active layer 120'. The spin-orbit current is in the x-y plane, which is also the plane of the layers of the memory 100'. The SO active layer 120' has a spin-orbit polarization that may give rise to spin-orbit field(s) such as $H_{SO}$. The spin-orbit field, $H_{SO}$, may have components due to the spin Hall effect, the Rashba effect, or both. Further, although shown perpendicular to the in-plane spin-orbit current, in other embodiments, the spin orbit field may be in another direction. The SO active layer 120' may have the same structure, function, and constituent material(s) as are described above. Thus, the SO active layer 120' may be used in assisting switching of the magnetic junction 110'.

In order to assist in switching the magnetic junction 110', the spin-orbit polarization $p_{SO}$ is perpendicular to the easy axis/stable state 113' of the free layer 112'. The easy axis 115' is perpendicular to plane, while the spin-orbit polarization is in plane (e.g. in the x-y plane). The spin-orbit torque $T_{SO}$ can rapidly deflect the perpendicular to the plane magnetic moment of the free layer 112' from its equilibrium state parallel to the easy axis. The spin-orbit torque $T_{SO}$ may be maximized in the initial position, thus enabling considerably large tilt of the magnetic moment of the free layer 121' in the very first instants after the SO current pulse is applied. Thus the spin-orbit torque $T_{SO}$ tilts the magnetization of the free layer considerably faster than conventional STT torque of similar maximum amplitude. Indeed, for a conventional reference layer magnetic moment that is collinear to the free layer magnetic moment, the conventional STT torque is small in the first instants after the STT pulse is applied. $T_{SO}$ deflects equally the magnetic moments of the free layer in states corresponding to logical one or zero (UP and DOWN positions, respectively, of the magnetic moment). However, the magnetic moment may not switch to the opposite orientation without more. Consequently, spin transfer torque may be applied in order to switch the magnetic moment of the free layer 112'. In addition to the in-plane current pulse for the SO active layer, an STT current pulse may be driven perpendicular to plane to complete switching. STT torque is the larger for larger tilts of the magnetization of the free layer 112' from the equilibrium position. The STT torque reaches a maximum when the magnetic moment of the free layer 112' is perpendicular to the free layer easy axis 115'. Therefore if the magnetization is tilted considerably due to the SO torque $T_{SO}$, then the STT torque can more quickly switch magnetization. Because the spin-orbit torque $T_{SO}$ can rapidly tilt the magnetization from the equilibrium position and in this tilted position the STT torque can rapidly switch the magnetization to a new equilibrium position, overall switching time can be significantly reduced compared to the case of the conventional STT torque only switching. Moreover, the write error rates can improve significantly. Thus the spin orbit interaction may be used in assisting the switching the magnetic moment of the free layer 112'.

Because the overall switching time is reduced for larger tilts of the magnetization of the free layer 112' by the spin-orbit torque $T_{SO}$, it is important for the magnitude of the spin-orbit torque $T_{SO}$ and corresponding field $H_{SO}$ to be sufficiently high. Therefore, the spin-orbit field is desired to be a significant percentage of the anisotropy field for the magnetic junction 110'. In some embodiments, the spin-orbit field is desired to be at least ten percent and not more than fifty percent of the anisotropy field for the magnetic junction 110'. However, in other embodiments, the spin-orbit field may have another value.

For the free layer magnetization to tilt reliably, the SO field pulse is sufficiently short for some embodiments. In such embodiments, the total duration of the SO field pulse is less than half the magnetization precession period for improved performance. For some embodiments, the magnetization precession period equals $\frac{1}{2}(2\pi/\gamma H_K)$, where Hk is the anisotropy field of the free layer 112'. Thus, the SO current pulse may be at least 30 ps and not more than 3 ns long, but depends on Hk. If instead the pulse width is on the order of the period of precession ($2\pi/\gamma H_K$ for some embodiments), then the magnetic moment returns to the stagnation point parallel to the easy axis. The SO field $H_R$ may not improve the speed of switching. If the pulse width is longer than the oscillation period, for example 1 nanosecond or more, then the eventual magnetization tilt may not be controlled.

For some other embodiments, if the SO field $H_{SO}$ has the form presented in expression in paragraph [039] and the $H_{SO}$ field is sufficiently high, the spin-orbit field $H_{SO}$ is able to rotate the magnetic moment of the free layer 112' as far as parallel (or antiparallel) to the polarization vector $p_{SO}$. For a free layer 112' having its easy axis perpendicular to plane, this corresponds to an orientation perpendicular to the easy axis. In this case of a very large amplitude of the SO torque $T_{SO}$, as long as the current pulse is driven through the SO active layer 120', the magnetic moment may remain rotated from the easy axis. Thus, if the spin-orbit current pulse has a large enough magnitude and width, the magnetic moment may remain pinned in plane due to the spin Hall effect. For such embodiments, there is no limitation on the duration of the SO field pulse. Moreover, the STT is maximized in case when the initial tilt of the magnetization of the free layer is perpendicular to the easy axis.

If the tilt of magnetization of the free layer by the spin-orbit torque is not very large (e.g. less than $\pi/4$ radians for some embodiments) and no STT torque is applied, then the magnetization may return to the initial magnetic state after the end of the SO field pulse. However, if the tilt is larger, the magnetization has a high chance to return to opposite position. If the tilt induced by $T_{SO}$ is close to $\pi/2$ and no STT pulse is applied, the magnetization may have equal chances of returning to the initial state and switching to the opposite state. Therefore, for a large tilt induced by $T_{SO}$, information in the cell can be disturbed or erased by the spin-orbit torque $T_{SO}$. For some embodiments, an optimum tilt due to the SO effect is determined by the trade-off between the speed (larger tilts) and limitation on the non-disturbance of the initial memory state (smaller tilts).

Figure 5:
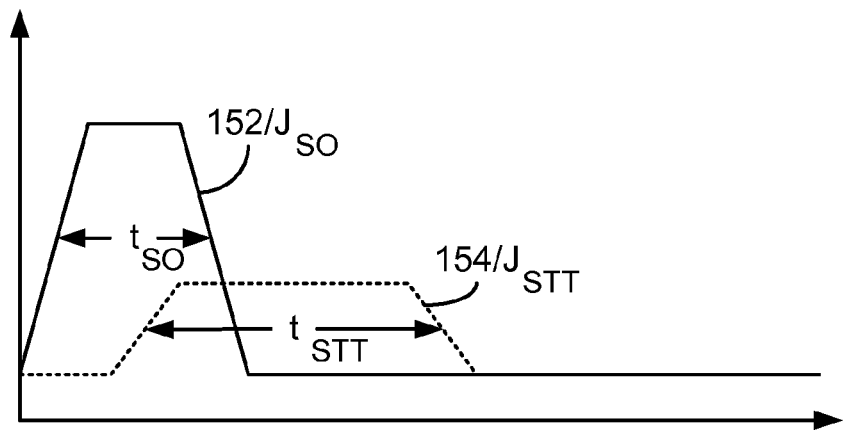
FIG. 5 depicts an exemplary embodiment of voltage pulses used in programming a magnetic junction switched using spin-orbit interaction.

In order to switch the magnetic moment 113' of the free layer 112', an in-plane spin-orbit (SO) current pulse ($J_{SO}$) is driven through the SO active layer 120'. Stated differently, the spin-orbit current pulse is driven perpendicular to the direction between the SO active layer 120' and the free layer 112' (e.g. perpendicular to the z-direction). The SO current pulse generates the spin-orbit field $H_{SO}$ in the manner described above. The spin-orbit field $H_{SO}$ perturbs the magnetic moment 113' of the free layer 112' from its equilibrium state along the easy axis 115' for sufficiently short pulse widths of the current $J_{SO}$. If the spin transfer current $J_{STT}$ is then applied, the magnetic moment 113' of the free layer 112' may be switched. The switching of the magnetic junction 110' may be improved. For example, FIG. 5 is a graph 150 depicting the timing of current pulses used in programming the memory 100'. Referring to FIGS. 4-5, the plots 152 and 154 shown in the graph 150 are for exemplary purposes only and are not meant to explicitly depict particular real-world pulses.

A SO current pulse 152 having a width $t_{SO}$ and magnitude $J_{SO}$ is driven through the SO active layer 120'. The width $t_{SO}$ is desired to be short to ensure that the magnetic moment 113' perturbed by any portion of the spin-orbit field generated by the Rashba effect does not precess back to the stagnation point. Thus, the width of the SO current pulse 152 is desired to be relative small, for example 0.1-3 nanoseconds. In some such embodiments, the width of the SO current pulse 152 is on the order of 30 picosecond-0.1 nanosecond. Further, because the SO current pulse 152 is in-plane for the SO active layer 120', the magnitude of the SO current pulse 152 may be large. For example, the current density $J_{SO}$ may be on the order of $1\times10^8$ A/cm$^2$ for when the free layer has high $H_K$ which corresponds to a current on the order of 0.01-1 mA. For some other applications, current density may be of the order of $1\times10^7$ A/cm$^2$.

After the start of the SO current pulse, the spin transfer torque (STT) current pulse 154 having a width $t_{STT}$ and a magnitude $J_{STT}$ is driven perpendicular to plane through the magnetic junction 110'. Thus, the STT current pulse 154 may commence before the magnetic moment 113' has an opportunity to precess back to the stagnation point. In the embodiment shown in FIG. 5, the STT current pulse 154 starts before the SO current pulse 152 terminates. However, in other embodiments, the STT current pulse 154 may start at or after termination of the SO current pulse 152. If the STT current pulse 154 starts after the SO current pulse 152 terminates, then only a small amount of time, for example not more than a few oscillation periods of the magnetic moment 113', is desired to pass between termination of the SO current pulse 152 and start of the STT current pulse 154. The magnitude of the STT current pulse 154 may be significantly smaller than that of the SO current pulse 152 because the STT current pulse 154 is perpendicular to plane. For example, $J_{STT}$ may be on the order of $1\times10^6$ A/cm$^2$. The width of the STT current pulse 154 may be as long as desired for switching the magnetic junction 110'. However, because the SO current pulse 152 is also used, switching may still be faster.

Using the current pulses 152 and 154, the magnetic memory 100' may be more rapidly switched. The SO current pulse 152 through the SO active layer 120' generates a spin-orbit field that perturbs the magnetic moment 113' from the stagnation point along the easy axis 115'. The spin transfer torque due to the STT current pulse 154 through the magnetic junction 110' may then act to greater effect in switching the magnetic moment 113'. Thus, the STT torque may be used to more rapidly switch the magnetic moment 113' of the magnetic junction 110'.

Because the spin-orbit torque may be used in switching the magnetic moment 113' of the free layer 112', performance of the memory 100' may be improved. The spin-orbit torque generated by the SO active layer 120' allows the magnetic junction 110' to be programmed at an increased speed. Because the spin-orbit torque has a high efficiency and is proportional to the magnitude of the in-plane spin-orbit current pulse 152, the spin-orbit torque may be large. The large spin-orbit torque may thus perturb the magnetic moment 113' from the stagnation point. The width and magnitude of the spin transfer torque pulse 154 may be reduced while still writing to the magnetic memory 100'. Thus, the write time may be reduced and the write error rate improved. Performance of the memory 100' may thereby be improved.

Figure 6:
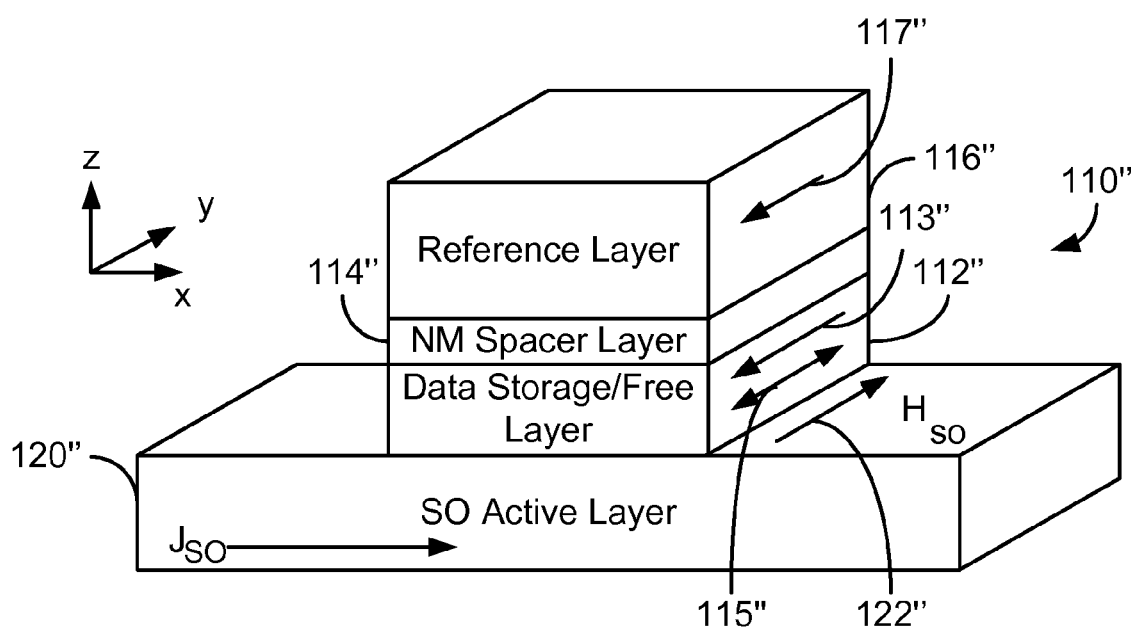
FIG. 6 depicts another exemplary embodiment of a magnetic junction switched using spin-orbit interaction.

FIG. 6 depicts an exemplary embodiment of a magnetic memory 100". For clarity, FIG. 6 is not to scale. The magnetic memory 100" is analogous to the magnetic memory 100. Consequently, similar components have analogous labels. The magnetic memory 100" thus includes a magnetic junction 110" and a SO active layer 120" that are analogous to the magnetic junction 110 and the SO active layer 120, respectively. The magnetic junction 110" includes a data storage/free layer 112", a nonmagnetic spacer layer 114", and a reference layer 116" that are analogous to the storage/free layer 112, the nonmagnetic spacer layer 114, and the reference layer 116, respectively. Thus, the structure and function of the components 110" and 120" are analogous to that described above for the components 110 and 120, respectively. The magnetic moment 113" of the free layer 112" is stable in-plane. The magnetic moment 113" is thus parallel to the easy axis 115" of the free layer 112". In the embodiment shown, the magnetic moment 117" of the reference layer 116" is also in-plane. For some embodiments this in-plane easy axis direction is perpendicular to the direction of the current, $J_{SO}$, in the SO active layer 120". As a result, $p_{so}$ is parallel to the easy axis 115" of the free layer 112".

The magnetic junction 110" is switched using spin-orbit torque as the primary switching mechanism. In some embodiments, the spin-orbit torque is generated from the spin Hall effect and/or Rashba effect. The SO active layer 120" may thus have the same structure, function, and constituent material(s) as are described above. The in-plane current $J_{SO}$ driven through the SO active layer 120" is the primary switching current. However, other mechanisms, discussed below, might be used in selecting the magnetic junction 110" and thus assist in programming the magnetic junction 110". Further, in other embodiments, other mechanisms and/or material(s) may be used.

In order to program the magnetic junction 110", the spin-orbit field is generated with the spin-orbit polarization $p_{SO}$ being along the easy axis/stable state 115" of the free layer 112" in the direction to which the magnetic moment 113" is desired to be switched. The spin-orbit current required to be driven through the SO active layer 120" is on the order of $J_{STT}$—a few MA/cm². In the embodiment shown in FIG. 6, the magnetic moment 113" is desired to change direction to be in the +y direction. To switch the magnetic moment 113" to the −y direction, the spin-orbit current $J_{SO}$ is driven in the opposite direction to that shown. The spin-orbit field 122" generated by the spin-orbit interaction applies a spin-orbit torque to the magnetic moment 113", switching the magnetic moment 113" to the desired direction.

Because the spin-orbit torque switches the magnetic moment 113" of the free layer 112", performance of the memory 100' may be improved. Because the SO current is in-plane for the SO active layer 120" and, therefore, does not flow through the spacer 114", the current density $J_{SO}$ may be large. For example, the current density may be up to the order of $1 \times 10^8$ A/cm², which corresponds to a current on the order of 0.01-1 mA. Such a large current may provide a large spin-orbit field and, therefore, a larger spin-orbit torque on the magnetic junction 113". Stated differently, overdrive of the magnetic junction 110" may be more readily accomplished. Further, the magnetic junction 110" may be a single magnetic junction, instead of a dual magnetic junction including two reference layers. Thus, issues such as magnetoresistance cancellation and issues with growing the barrier layers for a dual junction. Thus, performance of the memory 100" may be improved.

Figure 7:
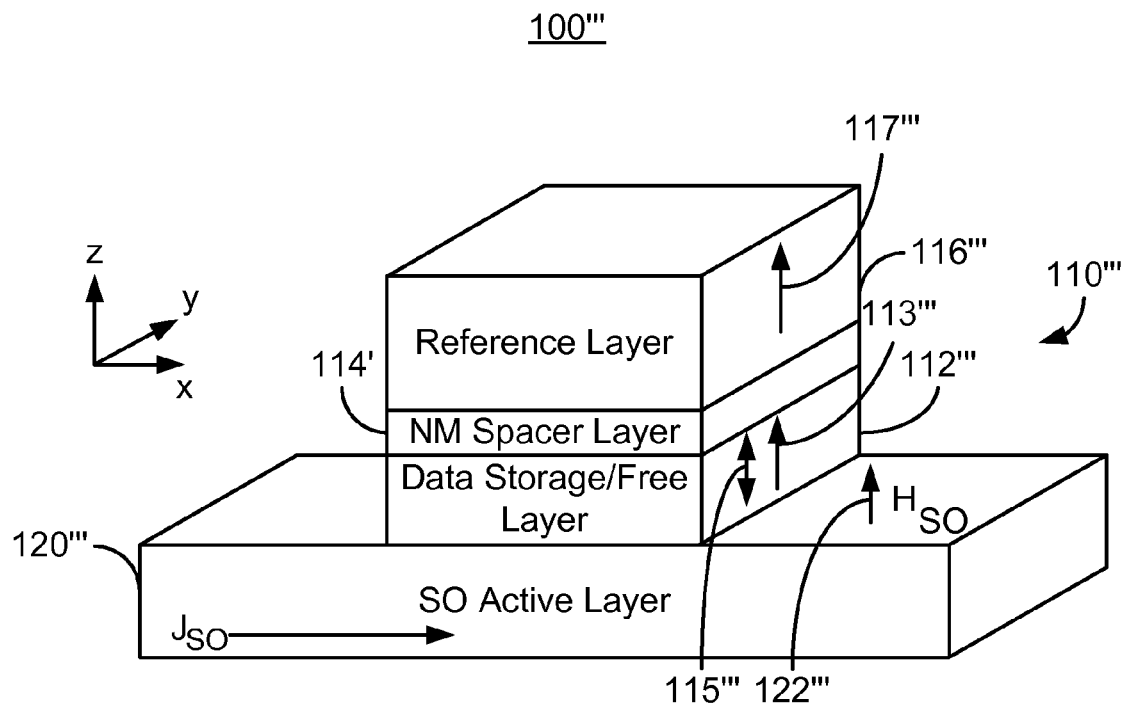
FIG. 7 depicts another exemplary embodiment of a magnetic junction switched using spin-orbit interaction.

FIG. 7 depicts an exemplary embodiment of a magnetic memory 100'''. For clarity, FIG. 7 is not to scale. The magnetic memory 100''' is analogous to the magnetic memories 100/100". Consequently, similar components have analogous labels. The magnetic memory 100''' thus includes a magnetic junction 110''' and a SO active layer 120''' that are analogous to the magnetic junction 110/110" and the SO active layer 120/120", respectively. The magnetic junction 110''' includes a data storage/free layer 112''', a nonmagnetic spacer layer 114''', and a reference layer 116''' that are analogous to the storage/free layer 112/112", the nonmagnetic spacer layer 114/114", and the reference layer 116/116", respectively. Thus, the structure and function of the components 110''' and 120''' are analogous to that described above for the components 110/110" and 120/120", respectively. The magnetic moment 113''' of the free layer 112''' is stable perpendicular to plane. The magnetic moment 113''' is thus parallel to the easy axis 115''' of the free layer 112'''. In the embodiment shown, the magnetic moment 117''' of the reference layer 116''' is also perpendicular to plane.

The magnetic junction 110" is switched using spin-orbit torque as the primary switching mechanism. In some embodiments, the spin-orbit torque is generated from the Rashba effect. The SO active layer 120''' may thus have the same structure, function, and constituent material(s) as are described above for the Rashba effect. However, in other embodiments, other mechanisms and/or material(s) may be used. The in-plane current $J_{SO}$ driven through the SO active layer 120''' is the primary switching current. However, other mechanisms might be used in selecting the magnetic junction 110''' and thus assist in programming the magnetic junction 110'''.

In order to program the magnetic junction 110''', the spin-orbit field is generated, with the spin-orbit polarization $p_{SO}$ being along the easy axis/stable state 115''' of the free layer 112''' in the direction to which the magnetic moment 113''' is desired to be switched. In some embodiments this spin-orbit field is primarily or entirely generated by the Rashba effect. The spin-orbit current required to be driven through the SO active layer 120''' is on the order of $J_{STT}$—a few MA/cm². In the embodiment shown in FIG. 7, the magnetic moment 113''' is desired to change direction to be in the +z direction. To switch the magnetic moment 113''' to the −z direction, the spin-orbit current $J_{SO}$ is driven in the opposite direction to that shown. The spin-orbit field 122''' generated by the spin-orbit interaction applies a spin-orbit torque to the magnetic moment 113''', switching the magnetic moment 113'' to the desired direction.

The magnetic memory 100''' shares the benefits of the magnetic memory 100''. Because the spin-orbit torque switches the magnetic moment 113''' of the free layer 112''', performance of the memory 100''' may be improved. Because the SO current is in-plane for the SO active layer 120'', the current density $J_{SO}$ may be large. Thus, overdrive of the magnetic junction 110'' may be more readily accomplished. Further, the magnetic junction 110''' may be a single magnetic junction, instead of a dual magnetic junction including two reference layers. Thus, issues such as magnetoresistance cancellation and issues with growing the barrier layers for a dual junction. Thus, performance of the memory 100''' may be improved.

Thus, the spin-orbit interaction may be used as a mechanism for switching the magnetic moment of the data storage/free layer 112/112'/112''/112''' of a magnetic junction. Spin-orbit interaction may assist switching such as spin transfer torque switching or may be used as the primary switching mechanism. Spin-orbit interaction allows for a higher torque because the in-plane spin-orbit current may be larger, allowing for faster switching with improved write error rates. In addition, the use dual magnetic junctions that are favored for STT-RAM memories but which may have a variety of issues may be avoided. Accordingly, performance of the magnetic memory 100, 100', 100'', and/or 100''' may be enhanced.

Figure 8:
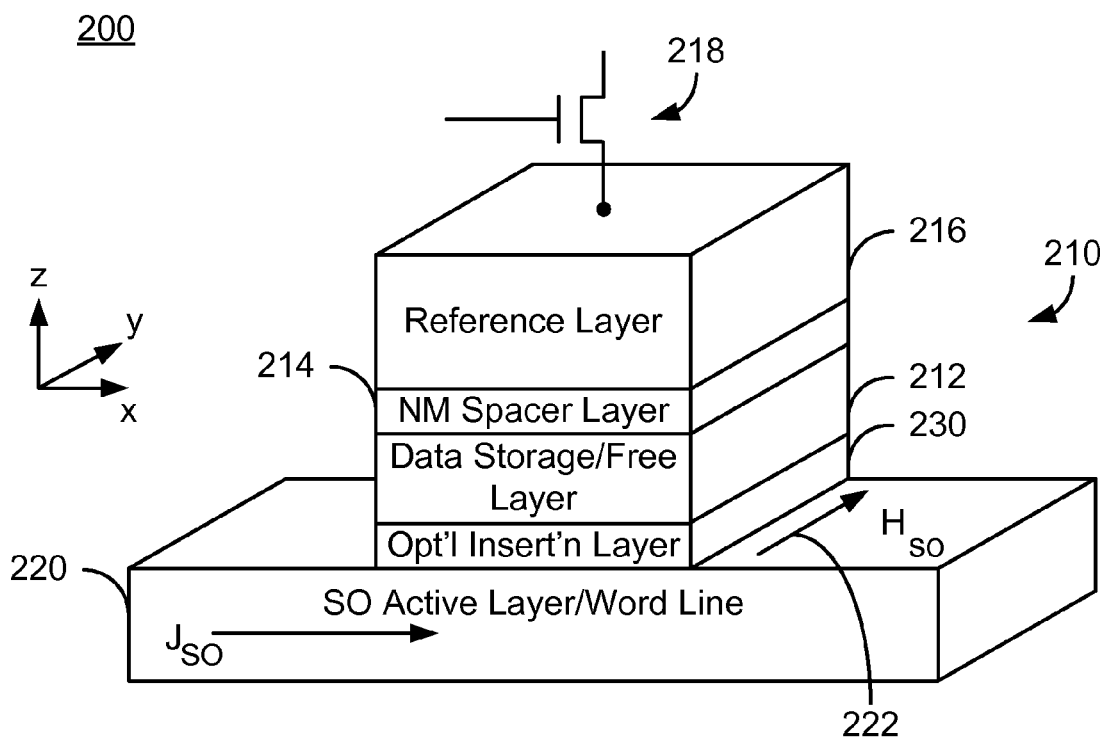
FIG. 8 depicts another exemplary embodiment of a magnetic junction switched using spin-orbit interaction.

FIG. 8 depicts an exemplary embodiment of a magnetic memory 200 employing a magnetic junction 210 switched using spin-orbit interaction. For clarity, FIG. 8 is not to scale. The magnetic memory 200 is analogous to the magnetic memories 100, 100', 100'', and 100'''. Consequently, similar components have analogous labels. The magnetic memory 200 thus includes a magnetic junction 210 and a SO active layer 220 that are analogous to the magnetic junction 110/110'/110''/110''' and the SO active layer 120/120'/120''/120''', respectively. The magnetic junction 210 includes a data storage/free layer 212, a nonmagnetic spacer layer 214, and a reference layer 216 that are analogous to the storage/free layer 112/112'/112''/112''', the nonmagnetic spacer layer 114/114'/114''/114''', and the reference layer 116/116'/116''/116''', respectively. Thus, the structure and function of the components 210 and 220 are analogous to that described above for the components 110/110'/110''/110'' and 120/120'/120''/120'', respectively. For example, the free layer 212 may have an easy axis in plane or perpendicular to plane and is used to store data. The reference layer 216 may also have its magnetic moment fixed in plane or perpendicular to plane. The magnetic junction 210 may be switched using spin-orbit interaction either as a primary mechanism or to assist another mechanism such as spin transfer torque as described above.

In addition to the magnetic junction 210, the magnetic memory 200 includes a selection device 218 corresponding to each magnetic junction 210. In the embodiment shown, a memory cell includes a magnetic junction 210 and a selection device 218. The selection device 218 is a transistor and may be coupled with a bit line. In the embodiment shown, magnetic memory 200 may also include an optional spin diffusion insertion layer 230. The optional spin diffusion layer 230 for some embodiments is a metal. In other embodiments, however, this layer can be a thin insulating material, e.g. crystalline MgO or other oxide or other insulating layer. The resistance-area (RA) of such layer should be small, e.g. smaller than 2 Ohm-μm². In other embodiments, the optional spin-diffusion layer 230 can be a multilayer including of two or more layers of different materials. The optional spin diffusion insertion layer 230 may be used to diminish the contribution to the spin-orbit field given by Equation in paragraph [045], or/and to enhance the contribution to the spin-orbit field given by equation in paragraph [041], if this is desired to be the primary contribution used in switching the magnetic junction 210. The optional spin diffusion insertion layer 230 may also be used to provide an improved seed layer for the free layer 212 and/or to reduce damping of the free layer, which can be associated with a proximity to the SO active layer 220.

Although only one magnetic junction 210 is shown in FIG. 8, the SO active layer 220 extends over multiple magnetic junctions. Thus, the SO active layer 220 may also function as a word line. Further, the SO active layer 220 is shown as having a substantially constant thickness (dimension in the z-direction) and width (dimension in the y-direction). In some embodiments, the thickness and/or width of the SO active layer are reduced at least under the magnetic junction 210. In such embodiments, the spin-orbit current density is increased in the region of the magnetic junction 210. Thus, switching using spin-orbit interaction may be improved.

The magnetic memory 200 shares the benefits of the magnetic memories 100, 100', 100'', and 100'''. Because the spin-orbit torque is used in switching the magnetic moment 213 of the free layer 212, performance of the memory 200 may be improved. Because the SO current is in-plane for the SO active layer 220, the current density $J_{SO}$ may be large. Thus, overdrive of the magnetic junction 210 may be more readily accomplished. Further, the magnetic junction 210 may be a single magnetic junction, instead of a dual magnetic junction including two reference layers. Thus, issues such as magnetoresistance cancellation and issues with growing the barrier layers for a dual junction. Thus, performance of the memory 200 may be improved.

Figure 9:
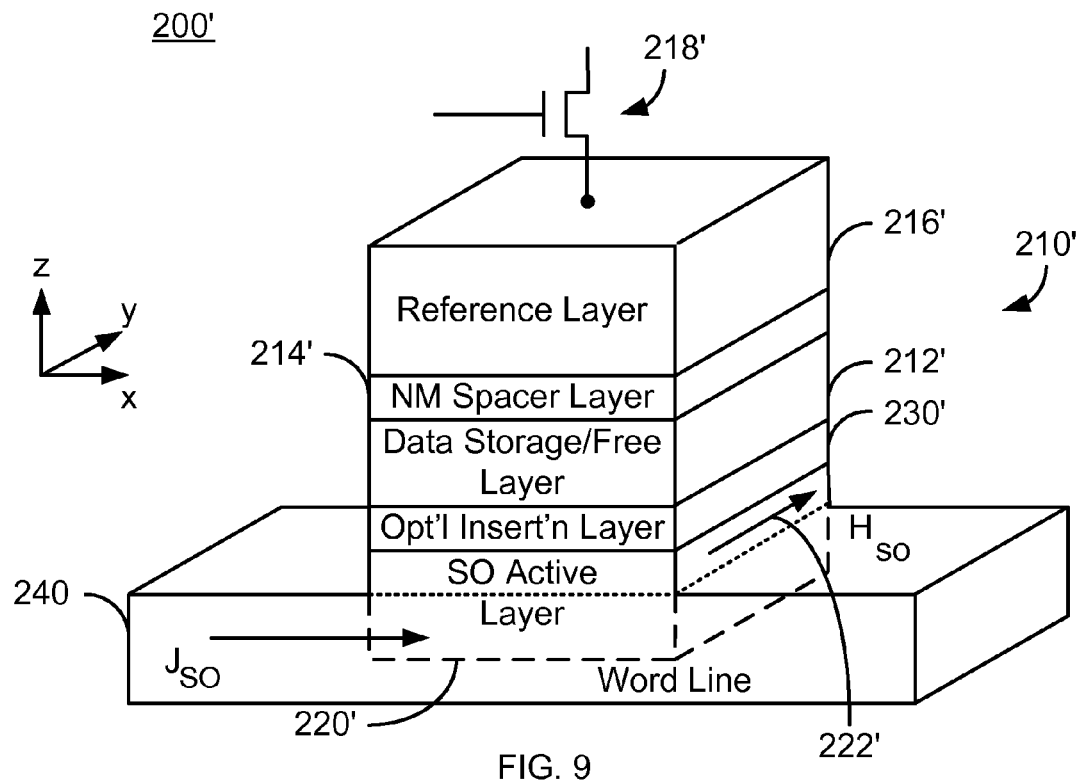
FIG. 9 depicts another exemplary embodiment of a magnetic junction switched using spin-orbit interaction.

FIG. 9 depicts an exemplary embodiment of a magnetic memory 200' employing a magnetic junction 210' switched using spin-orbit interaction. For clarity, FIG. 9 is not to scale. The magnetic memory 200' is analogous to the magnetic memories 200, 100, 100', 100'', 100'''. Consequently, similar components have analogous labels. The magnetic memory 200' thus includes a magnetic junction 210' and a SO active layer 220' that are analogous to the magnetic junction 210/110/110'/110''/110'' and the SO active layer 220/120/120'/120''/120''', respectively. The magnetic junction 210' includes a data storage/free layer 212', a nonmagnetic spacer layer 214', and a reference layer 216' that are analogous to the storage/free layer 212/112/112'/112''/112''', the nonmagnetic spacer layer 214/114/114'/114''/114''', and the reference layer 216/116/116'/116''/116''', respectively. Thus, the structure and function of the components 210' and 220' are analogous to that described above for the components 210/110/110'/110''/110'' and 220/120/120'/120''/120'', respectively. For example, the free layer 212' may have an easy axis in plane or perpendicular to plane and is used to store data. The reference layer 216' may also have its magnetic moment fixed in plane or perpendicular to plane. The magnetic junction 210' may be switched using spin-orbit interaction either as a primary mechanism or to assist another mechanism such as spin transfer torque as described above. The magnetic memory 200' may also include an optional spin diffusion insertion layer 230' analogous to the optional spin diffusion insertion layer 230. For simplicity, the SO field 222' is shown in the y-direction. However, the SO field 222' may be in another direction including but not limited to perpendicular to plane (e.g. in the positive or negative z direction).

The magnetic memory 200' also includes a word line 240. The word line 240 extends over multiple magnetic junctions 210' and, therefore, multiple memory cells. The SO active layer 220' is electrically coupled with the word line, but is localized in the region of a single magnetic junction 210'. Thus, in the embodiment shown, each SO active layer 220' corresponds to a magnetic junction 210'. In the embodiment shown, the SO active layer 220' extends above the word line 240. However, in other embodiments, the top of the SO active layer 220' may be at another location including but not limited to substantially even with the top of the word line 240. In the embodiment shown, the bottom of the SO active layer 220' is within the word line 240. Thus, the SO active layer 220' may reside in a depression within the word line 240. However, in other embodiments, the bottom of the SO active layer 220' may be at another location. Alternatively, the SO active layer 220' may have a thickness that is less than or equal to that of the word line 240 and reside in an aperture in the word line. In such embodiments, the current density through the SO active layer 220' may be greater than in the surrounding word line 240. The SO active layer 220' is also shown as extending to the edges of the magnetic junction 210'. However, in other embodiments, the SO active layer 220' may extend further than the magnetic junction 210' in the x-y plane.

The magnetic memory 200' shares the benefits of the magnetic memories 200, 100, 100', 100'', and 100'''. Because the spin-orbit torque is used in switching the magnetic moment 213' of the free layer 212', performance of the memory 200' may be improved. Because the SO current is in-plane for the SO active layer 220', the current density $J_{SO}$ may be large. Thus, overdrive of the magnetic junction 210' may be more readily accomplished. Further, the magnetic junction 210' may be a single magnetic junction, instead of a dual magnetic junction including two reference layers. Thus, issues such as magnetoresistance cancellation and issues with growing the barrier layers for a dual junction. Thus, performance of the memory 200' may be improved.

Figure 10:
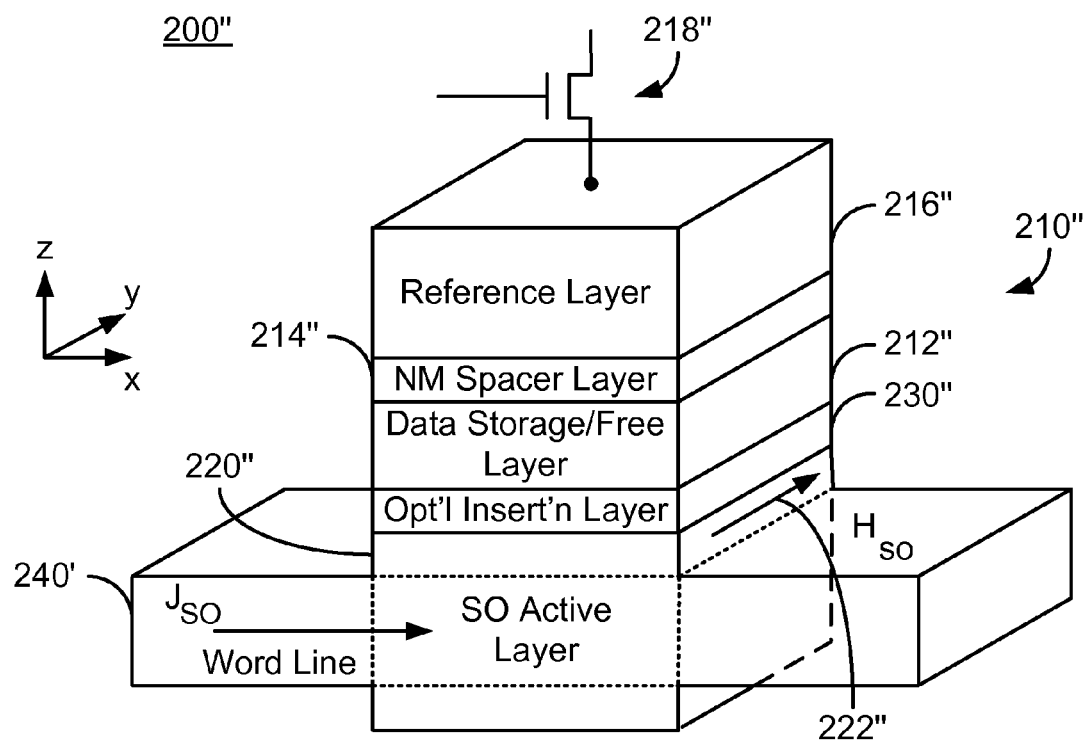
FIG. 10 depicts another exemplary embodiment of a magnetic junction switched using spin-orbit interaction.

FIG. 10 depicts an exemplary embodiment of a magnetic memory 200'' employing a magnetic junction 210'' switched using spin-orbit interaction. For clarity, FIG. 10 is not to scale. The magnetic memory 200'' is analogous to the magnetic memories 200, 200', 100, 100', 100'', 100'''. Consequently, similar components have analogous labels. The magnetic memory 200'' thus includes a magnetic junction 210'' and a SO active layer 220'' that are analogous to the magnetic junction 210/210'/210''/110/110'/110''/110'' and the SO active layer 220/220'/120/120'/120''/120''', respectively. The magnetic junction 210'' includes a data storage/free layer 212'', a nonmagnetic spacer layer 214'', and a reference layer 216'' that are analogous to the storage/free layer 212/212'/112/112'/112''/112''', the nonmagnetic spacer layer 214/214'/114/114'/114''/114''', and the reference layer 216/216'/116/116'/116''/116''', respectively. Thus, the structure and function of the components 210'' and 220'' are analogous to that described above for the components 210/210'/110/110'/110''/110'' and 220/220'/120/120'/120''/120''', respectively. For example, the free layer 212'' may have an easy axis in plane or perpendicular to plane and is used to store data. The reference layer 216'' may also have its magnetic moment fixed in plane or perpendicular to plane. The magnetic junction 210'' may be switched using spin-orbit interaction either as a primary mechanism or to assist another mechanism such as spin transfer torque as described above. The magnetic memory 200'' may also include an optional spin diffusion insertion layer 230'' analogous to the optional spin diffusion insertion layer 230/230'. For simplicity, the SO field 222'' is shown in the y-direction. However, the SO field 222'' may be in another direction including but not limited to perpendicular to plane (e.g. in the positive or negative z direction).

The magnetic memory 200'' also includes a word line 240' analogous to the word line 240. The word line 240' extends over multiple magnetic junctions 210' and, therefore, multiple memory cells. The SO active layer 220'' is electrically coupled with the word line, but is localized in the region of a single magnetic junction 210''. Thus, in the embodiment shown, each SO active layer 220'' corresponds to a magnetic junction 210''. In the embodiment shown, the SO active layer 220'' extends above and below the word line 240'. In the embodiment shown, the SO active layer 220' resides in an aperture within the word line 240'. However, in other embodiments, the top and/or bottom of the SO active layer 220'' may be at another location. The SO active layer 220'' is also shown as extending to the edges of the magnetic junction 210''. However, in other embodiments, the SO active layer 220'' may extend further than the magnetic junction 210'' in the x-y plane.

The magnetic memory 200'' shares the benefits of the magnetic memories 200, 200', 100, 100', 100'', and 100'''. Because the spin-orbit torque is used in switching the magnetic moment 213'' of the free layer 212'', performance of the memory 200'' may be improved. Because the SO current is in-plane for the SO active layer 220'', the current density $J_{SO}$ may be large. Thus, overdrive of the magnetic junction 210'' may be more readily accomplished. Further, the magnetic junction 210'' may be a single magnetic junction, instead of a dual magnetic junction including two reference layers. Thus, issues such as magnetoresistance cancellation and issues with growing the barrier layers for a dual junction. Thus, performance of the memory 200'' may be improved.

Figure 11:
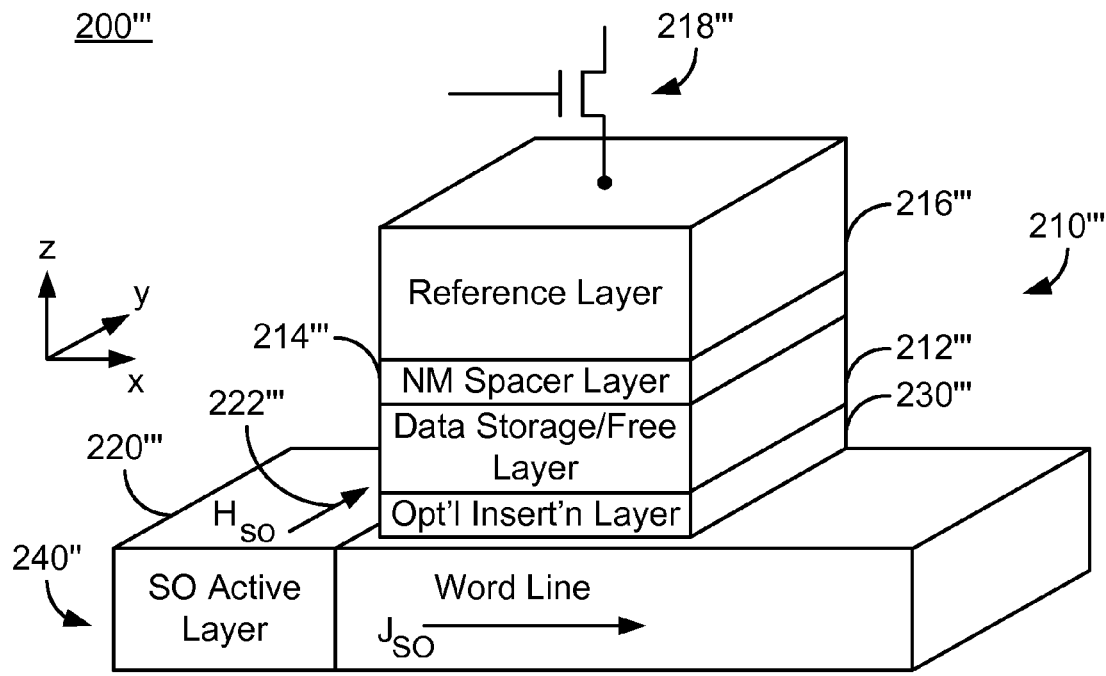
FIG. 11 depicts another exemplary embodiment of a magnetic junction switched using spin-orbit interaction.

FIG. 11 depicts an exemplary embodiment of a magnetic memory 200''' employing a magnetic junction 210''' switched using spin-orbit interaction. For clarity, FIG. 11 is not to scale. The magnetic memory 200'' is analogous to the magnetic memories 200, 200', 200'', 100, 100', 100'', 100'''. Consequently, similar components have analogous labels. The magnetic memory 200''' thus includes a magnetic junction 210''' and a SO active layer 220''' that are analogous to the magnetic junction 210/210'/210''/110/110'/110''/110'' and the SO active layer 220/220'/220''/120/120'/120''/120''', respectively. The magnetic junction 210''' includes a data storage/free layer 212''', a nonmagnetic spacer layer 214''', and a reference layer 216''' that are analogous to the storage/free layer 212/212'/212''/112/112'/112''/112''', the nonmagnetic spacer layer 214/214'/214''/114/114'/114''/114''', and the reference layer 216/216'/216''/116/116'/116''/116''', respectively. Thus, the structure and function of the components 210''' and 220''' are analogous to that described above for the components 210/210'/210''/110/110'/110''/110'' and 220/220'/220''/120/120'/120''/120'', respectively. For example, the free layer 212''' may have an easy axis in plane or perpendicular to plane and is used to store data. The reference layer 216''' may also have its magnetic moment fixed in plane or perpendicular to plane. The magnetic junction 210''' may be switched using spin-orbit interaction either as a primary mechanism or to assist another mechanism such as spin transfer torque as described above. The magnetic memory 200''' may also include an optional spin diffusion insertion layer 230''' analogous to the optional spin diffusion insertion layer 230/230'/230''. For simplicity, the SO field 222''' is shown in the y-direction. However, the SO field 222''' may be in another direction including but not limited to perpendicular to plane (e.g. in the positive or negative z direction).

The magnetic memory 200''' also includes a word line 240'' analogous to the word line 240/240'. The word line 240'' extends over multiple magnetic junctions 210'' and, therefore, multiple memory cells. The SO active layer 220''' is electrically coupled with the word line, but is localized in the region of a single magnetic junction 210'''. In the embodiment shown, the SO active layer 220''' is adjacent to the magnetic junction 210'''. The SO active layer 220''' is not directly below the free layer 212'''. Instead, another portion of the word line 240'' is under the magnetic junction 210'''. SO active layer 220''' can be at some separation from the magnetic junction 210'''. This separation should be not very large, typically smaller than the width of the MTJ. However for some other embodiments, it can be larger than that, up to 100 nm.

The magnetic memory 200''' shares the benefits of the magnetic memories 200, 200', 200'', 100, 100', 100'', and 100'''. Because the spin-orbit torque is used in switching the magnetic moment 213''' of the free layer 212''', performance of the memory 200''' may be improved. Because the SO current is in-plane for the SO active layer 220''', the current density $J_{SO}$ may be large. Thus, overdrive of the magnetic junction 210''' may be more readily accomplished. Further, the magnetic junction 210''' may be a single magnetic junction, instead of a dual magnetic junction including two reference layers. Thus, issues such as magnetoresistance cancellation and issues with growing the barrier layers for a dual junction. Thus, performance of the memory 200''' may be improved.

Figure 12:
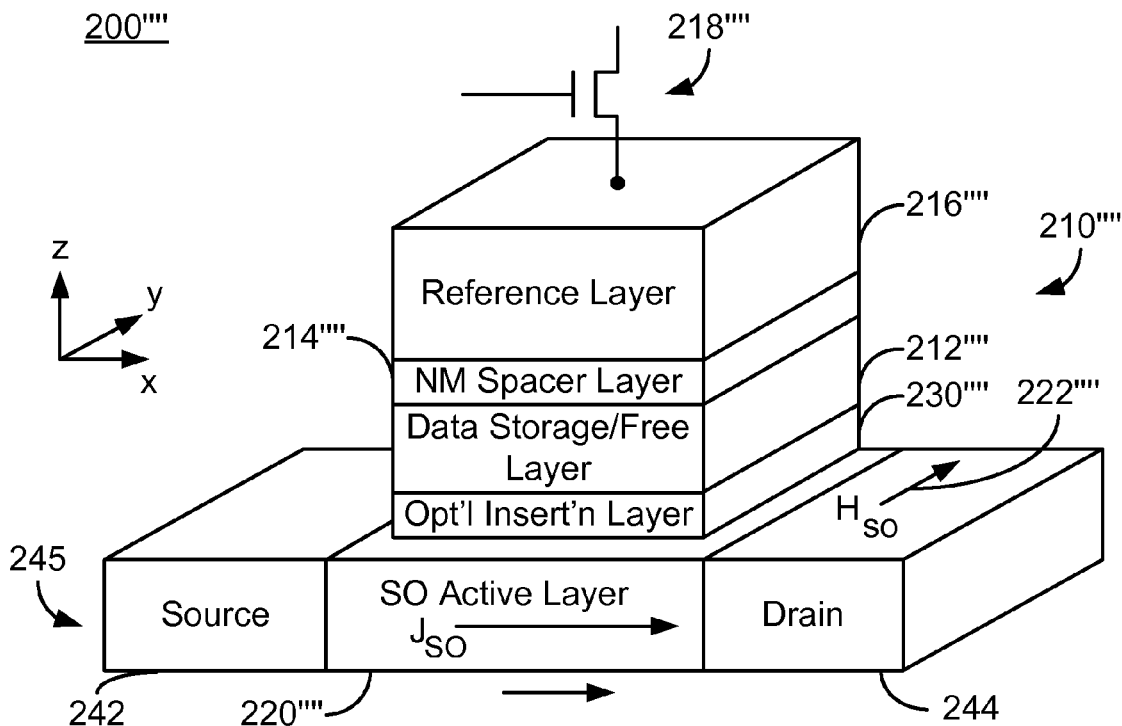
FIG. 12 depicts another exemplary embodiment of a magnetic junction switched using spin-orbit interaction.

FIG. 12 depicts an exemplary embodiment of a magnetic memory 200'''' employing a magnetic junction 210'''' switched using spin-orbit interaction. For clarity, FIG. 12 is not to scale. The magnetic memory 200'''' is analogous to the magnetic memories 200, 200', 200'', 200''', 100, 100', 100'', 100'''. Consequently, similar components have analogous labels. The magnetic memory 200'''' thus includes a magnetic junction 210'''' and a SO active layer 220'''' that are analogous to the magnetic junction 210/210'/210''/210'''/110/110'/110''/110'' and the SO active layer 220/220'/220''/220'''/120/120'/120''/120''', respectively. The magnetic junction 210'''' includes a data storage/free layer 212'''', a nonmagnetic spacer layer 214'''', and a reference layer 216'''' that are analogous to the storage/free layer 212/212'/212''/212'''/112/112'/112''/112''', the nonmagnetic spacer layer 214/214'/214''/214'''/114/114'/114''/114''', and the reference layer 216/216'/216''/216'''/116/116'/116''/116''', respectively. Thus, the structure and function of the components 210'''' and 220'''' are analogous to that described above for the components 210/210'/210''/210'''/110/110'/110''/110'' and 220/220'/220''/220'''/120/120'/120''/120'', respectively. For example, the free layer 212'''' may have an easy axis in plane or perpendicular to plane and is used to store data. The reference layer 216'''' may also have its magnetic moment fixed in plane or perpendicular to plane. The magnetic junction 210'''' may be switched using spin-orbit interaction either as a primary mechanism or to assist another mechanism such as spin transfer torque as described above. The magnetic memory 200'''' may also include an optional spin diffusion insertion layer 230'''' analogous to the optional spin diffusion insertion layer 230/230'/230''/230'''. For simplicity, the SO field 222'''' is shown in the y-direction. However, the SO field 222'''' may be in another direction including but not limited to perpendicular to plane (e.g. in the positive or negative z direction).

The magnetic memory 200''' also includes a transistor 245 which may be part of a conductive line. The transistor includes a source 247 and drain 248 separated by the SO active layer 220''''. The transistor 245 also includes a gate (not shown) which may be offset from the magnetic junction 210'''' in the y direction. Thus, the SO active layer 220''' may thus be part of a channel through which the in-plane spin-orbit current flows.

The magnetic memory 200'''' shares the benefits of the magnetic memories 200, 200', 200'', 200''', 100, 100', 100'', and 100'''. Because the spin-orbit torque is used in switching the magnetic moment 213'''' of the free layer 212'''', performance of the memory 200'''' may be improved. Because the SO current is in-plane for the SO active layer 220'''', the current density $J_{SO}$ may be large. Thus, overdrive of the magnetic junction 210'''' may be more readily accomplished. Further, the magnetic junction 210'''' may be a single magnetic junction, instead of a dual magnetic junction including two reference layers. Thus, issues such as magnetoresistance cancellation and issues with growing the barrier layers for a dual junction. Thus, performance of the memory 200'''' may be improved.

Figure 13:
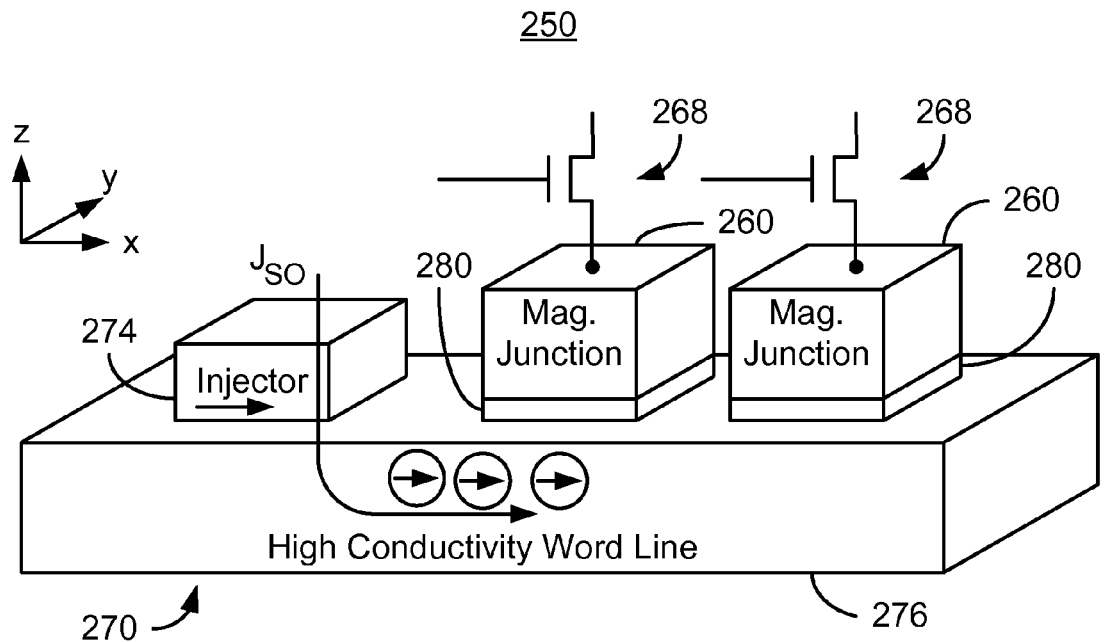
FIG. 13 depicts an exemplary embodiment of magnetic junctions switched using spin-orbit interaction.

FIG. 13 depicts an exemplary embodiment of a magnetic memory 250 employing a magnetic junction 260 switched using a feature that mimics spin-orbit interaction. For clarity, FIG. 13 is not to scale. The magnetic memory 250 is analogous to the magnetic memories 200, 200', 200'', 200''', 200'''', 100, 100', 100'', 100'''. Consequently, similar components have analogous labels. The magnetic memory 250 thus includes a magnetic junction 260 and a structure 270 that are analogous to the magnetic junction 210/210'/210''/210'''/210''''/110/110'/110''/110'' and the SO active layer 220/220'/220''/220'''/220''''/120/120'/120''/120''', respectively. The magnetic junction 260 includes a data storage/free layer 262, a nonmagnetic spacer layer 264, and a reference layer 266 that are analogous to the storage/free layer 212/212'/212''/212'''/212''''/112/112'/112''/112''', the nonmagnetic spacer layer 214/214'/214''/214'''/214''''/114/114'/114''/114''', and the reference layer 216/216'/216''/216'''/216''''/116/116'/116''/116''', respectively. Thus, the structure and function of the components 260 and 270 are analogous to that described above for the components 210/210'/210''/210'''/210''''/110/110'/110''/110'' and 220/220'/220''/220'''/220''''/120/120'/120''/120'', respectively. For example, the free layer 262 may have an easy axis in plane or perpendicular to plane and is used to store data. The reference layer 266 may also have its magnetic moment fixed in plane or perpendicular to plane. The magnetic junction 260 may be switched using polarized current carriers analogous to spin-orbit interaction either as a primary mechanism or to assist another mechanism such as spin transfer torque as described above. The magnetic memory 250 may also include an optional spin diffusion insertion layer 280 analogous to the optional spin diffusion insertion layer 230/230'/230''/230'''/230''''.

In the context of the present application, the magnetic memory 250 is considered to use spin-orbit interaction in switching the magnetic junctions 260 because a structure 270 analogous to the SO active layer is used. More specifically, the structure 270 external to the magnetic junctions 260 provides a spin polarized in-plane current used in switching the magnetic junction 260. Thus, the switching mechanism for the memory 250 mimics spin-orbit interaction.

In the magnetic memory 250, the structure 270 analogous the SO active layer is formed from a combination of a high conductivity word line 276 and at least one spin polarized injector 274. In the embodiment shown in FIG. 13, only a single spin polarized current injector 224 is used. However, in other embodiments, multiple spin polarized injectors may be used. For example, two injectors having opposite spin polarities may be used. Alternatively, a single polarized spin injector 274 may be used, but the direction of current reversed. The spin polarized current injector 274 polarizes the spins of charge carriers for a current driven through the spin polarized current injector 274. For example, the spin polarized current injector 274 may be a magnetic layer. Further, a single spin polarized injector 274 is desired to provide polarized spins for multiple magnetic junctions 260. Thus, the high conductivity word line 276 is at least one conductive layer having a high spin diffusion length. For example, the spin diffusion length is at least one hundred nanometers in some embodiments. In some such embodiments, the spin diffusion length is at least one micron. For example, in one embodiment, the high conductivity word line 276 may be a graphene line. The high spin diffusion length is desired so that the spin polarized charge carriers from the injector 274 may traverse the word line 276 and reach at least one magnetic junction 260 without undergoing significant scattering that destroys the charge carriers' spin information.

Because the current is polarized by the injector 274 and retains its spin information as it travels through the high conductivity word line 276, the polarized current acts in a manner similar to the polarization of spins described above for the spin Hall and Rashba effects. Thus, the combination of the injector 274 and high conductivity word line 276 functions in an analogous manner to the SO active layers 220/220'/220''/220'''220''''/120/120'/120''/120'''. Stated differently, the spin polarized current may provide a field and torque analogous to the spin-orbit field and torque. Using the spin polarized current either as a primary switching mechanism or to assist in switching, the magnetic junctions 260 may be written in an analogous manner described above.

The magnetic memory 250 shares the benefits of the magnetic memories 200, 200', 200'', 200''', 200'''', 100, 100', 100'', and 100'''. Because the spin-orbit torque is used in switching the magnetic moment of the free layer, performance of the memory 250 may be improved. Because the SO current is in-plane for the SO active layer 270, the current density $J_{SO}$ may be large. Thus, overdrive of the magnetic junction 260 may be more readily accomplished. Further, the magnetic junction 260 may be a single magnetic junction, instead of a dual magnetic junction including two reference layers. Thus, issues such as magnetoresistance cancellation and issues with growing the barrier layers for a dual junction. Thus, performance of the memory 250 may be improved.

Thus, the memories 200, 200', 200'', 200''', 200'''' and 250 depict various configurations of the SO active layer 220, 220', 220'', 220''', 220'''', and 270, respectively. As for the memories 100, 100', 100'', and 100''', the magnetic junctions 210, 210', 210'', 210''', 210'''' and 260 may use the spin-orbit torque as a primary switching mechanism or to assist the primary switching mechanism. If spin-orbit torque is used as a primary switching mechanism, without more, any magnetic junction 110, 110', 110'', 110''', 210, 210', 210'', 210''', 210'''' and 260 along the SO active layer or word line containing the SO active layer may be switched. Consequently, a mechanism for selecting the magnetic junction to be written is desired.

Figure 14:
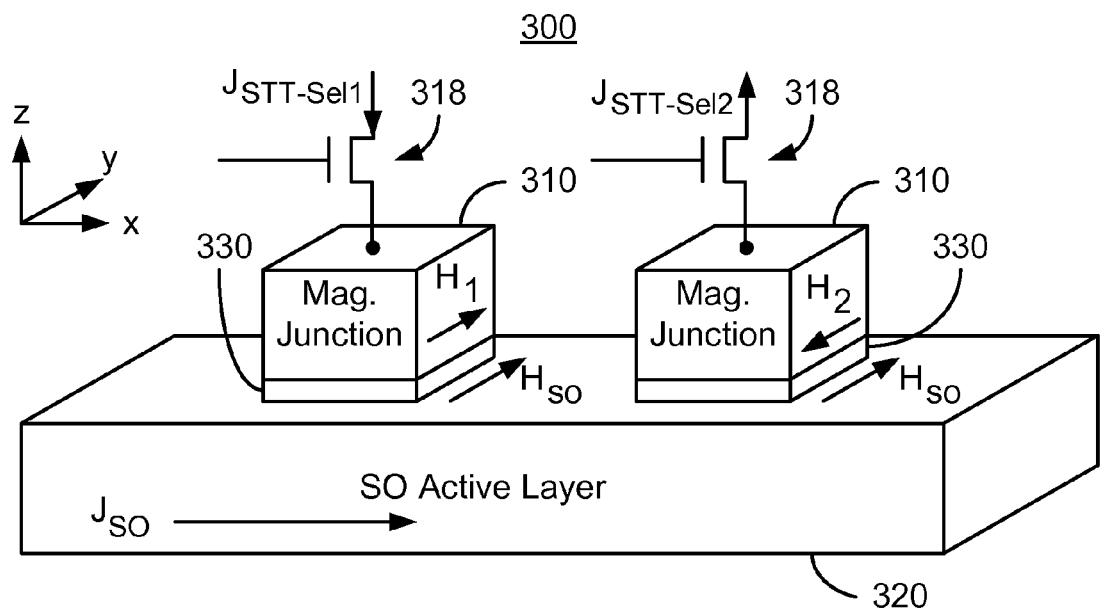
FIG. 14 depicts another exemplary embodiment of magnetic junctions switched using spin-orbit interaction.

FIG. 14 depicts an exemplary embodiment of a magnetic memory 300 employing magnetic junctions 310 switched primarily using spin-orbit interaction. For clarity, FIG. 14 is not to scale. The magnetic memory 300 is analogous to the magnetic memories 100, 100', 100'', 100''', 200, 200', 200'', 200''', 200'''', and 250. Consequently, similar components have analogous labels. The magnetic memory 300 thus includes magnetic junctions 310, selection devices 318, and a SO active layer 320 that are analogous to the magnetic junctions, selection devices, and the SO active layers previously described. Although not shown, the magnetic junction 310 includes a data storage/free layer, a nonmagnetic spacer layer, and a reference layer that are analogous to those previously described. Thus, the structure and function of the components 310 and 320 are analogous to that described above. Although the SO active layer 320 is depicted as a word line, in other embodiments, other configurations may be used. In addition, optional spin diffusion insertion layers 330 are shown. These layers 330 are analogous to the optional spin diffusion insertion layers 230, 230', 230'', 230''', 230'''' and/or 280. The free layers of the magnetic junctions 310 may each have an easy axis in plane or perpendicular to plane.

In the memory 300, the spin-orbit interaction switching is assisted by spin transfer torque. In particular, the SO active layer 320 is configured such that desired combination of the spin-orbit torque $H_{SO}$ and the spin transfer torque is sufficient to switch the magnetic junction. For example, in the embodiment shown, the first spin transfer selection current $J_{STT\text{-}Sel1}$ generates a STT torque with the effective STT field $H_1$ in the same direction as the spin-orbit field $H_{SO}$. Note that although $H_1$ and $H_{SO}$ are both shown in the x-y plane, in another embodiment, the fields $H_1$ and $H_{SO}$ may be in another direction including perpendicular to plane. Thus, this magnetic junction under the influence of $H_{SO}$ and $H_1$ is switched. However, the spin transfer selection current $J_{STT\text{-}Sel2}$ is driven in the opposite direction. Thus, the spin transfer torque with the field $H_2$ is in the opposite direction from the spin-orbit field $H_{SO}$. The combined action of $H_{SO}$ minus $H_2$ is not sufficient to switch the magnetic junction. Thus, although the magnetic junction 310 is not switched even if the spin-orbit torque $H_{SO}$ alone is sufficient to program the magnetic junction 310. In other embodiments, the selection may be performed in another manner. For example, in some embodiments, the spin transfer selection current is driven only through magnetic junctions 310 to be programmed. In such embodiments, the spin-orbit torque is insufficient to program the magnetic junction 310 without a spin transfer torque in the same direction. In other embodiments, the spin transfer selection current is driven only through magnetic junctions that are not to be programmed. In such embodiments, the spin-orbit torque is sufficient to program the magnetic junction 310 by itself. However, the combination of the spin-orbit torque and a spin transfer torque in the opposite direction is insufficient to program the magnetic junction. Thus, the magnetic memory 300 utilizes spin transfer torque to select the magnetic junction 310 to be written and uses spin-orbit torque as a primary switching mechanism.

The magnetic memory 300 shares the benefits of the magnetic memories 100, 100', 100'', 100''', 200, 200', 200'', 200''', 200'''', and/or 250. Because the spin-orbit torque is used in switching the magnetic moment of the free layer, performance of the memory 300 may be improved. Further, the desired magnetic junction 310 to be programmed may be selected using spin transfer torque. Thus, performance of the memory 300 may be improved.

Figure 15:
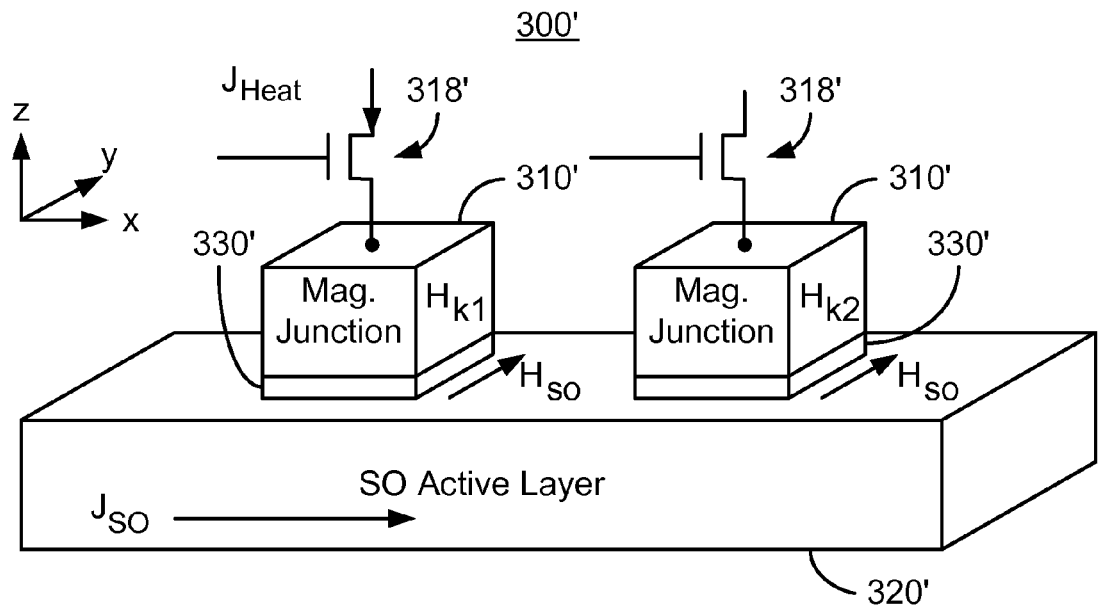
FIG. 15 depicts another exemplary embodiment of magnetic junctions switched using spin-orbit interaction.

FIG. 15 depicts an exemplary embodiment of a magnetic memory 300' employing magnetic junctions 310' switched primarily using spin-orbit interaction. For clarity, FIG. 15 is not to scale. The magnetic memory 300' is analogous to the magnetic memories 100, 100', 100'', 100''', 200, 200', 200'', 200''', 200'''', 250 and 300. Consequently, similar components have analogous labels. The magnetic memory 300' thus includes magnetic junctions 310', selection devices 318', an optional spin diffusion insertion layer 330', and a SO active layer 320' that are analogous to the magnetic junctions, selection devices, spin diffusion insertion layers, and the SO active layers previously described. Although not shown, the magnetic junction 310' includes a data storage/free layer, a nonmagnetic spacer layer, and a reference layer that are analogous to those previously described. Thus, the structure and function of the components 310' and 320' are analogous to that described above. Although the SO active layer 320' is depicted as a word line, in other embodiments, other configurations may be used. The free layers of the magnetic junctions 310' may each have an easy axis in plane or perpendicular to plane.

In the memory 300', the spin-orbit interaction switching is assisted by heat. In the embodiment shown, heat is generated in the desired magnetic junction 310 by driving a heating current, $J_{Heat}$, through the magnetic junction. For the magnetic junction that has been heated, the anisotropy field has been reduced to $H_{k1}$. This anisotropy field is sufficiently low that the spin-orbit field $H_{SO}$ exerts a sufficient torque to switch the magnetic junction 310'. In contrast, magnetic junctions 310 that are not to be switched are not heated and, therefore, have a higher anisotropy field of $H_{k2}$. The spin-orbit torque $H_{SO}$ is insufficient to switch the magnetic moment of the free layer for the unheated magnetic junctions 310'. Thus, the magnetic memory 300' utilizes heating of the magnetic junction 310 to select the magnetic junction 310 to be written and uses spin-orbit torque as a primary switching mechanism. Note that although $H_{k1}$, $H_{k2}$ and $H_{SO}$ are both shown in the x-y plane, in another embodiment, the fields $H_{k1}$, $H_{k2}$ and $H_{SO}$ may be in another direction including perpendicular to plane.

The magnetic memory 300' shares the benefits of the magnetic memories 100, 100', 100", 100''', 200, 200', 200", 200''', 200'''', 250, and/or 300. Because the spin-orbit torque is used in switching the magnetic moment of the free layer, performance of the memory 300 may be improved. Further, the desired magnetic junction 310' to be programmed may be selected using spin transfer torque. Thus, performance of the memory 300' may be improved.

Figure 16:
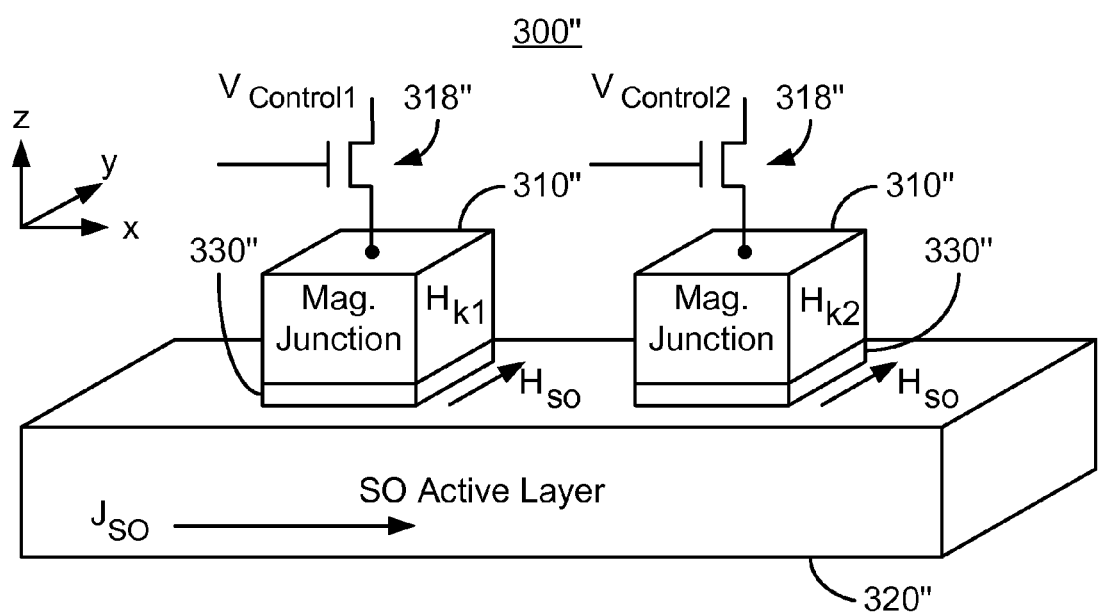
FIG. 16 depicts another exemplary embodiment of magnetic junctions switched using spin-orbit interaction.

FIG. 16 depicts an exemplary embodiment of a magnetic memory 300" employing magnetic junctions 310" switched primarily using spin-orbit interaction. For clarity, FIG. 16 is not to scale. The magnetic memory 300" is analogous to the magnetic memories 100, 100', 100", 100''', 200, 200', 200", 200''', 200'''', 250, 300 and 300'. Consequently, similar components have analogous labels. The magnetic memory 300" thus includes magnetic junctions 310", selection devices 318", an optional spin diffusion insertion layer 330", and a SO active layer 320' 'that are analogous to the magnetic junctions, selection devices, spin diffusion insertion layers, and the SO active layers previously described. Although not shown, the magnetic junction 310" includes a data storage/free layer, a nonmagnetic spacer layer, and a reference layer that are analogous to those previously described. Thus, the structure and function of the components 310" and 320" are analogous to that described above. Although the SO active layer 320" is depicted as a word line, in other embodiments, other configurations may be used. The free layers of the magnetic junctions 310" may each have an easy axis in plane or perpendicular to plane. Note that although $H_{k1}$, $H_{k2}$ and $H_{SO}$ are both shown in the x-y plane, in another embodiment, the fields $H_{k1}$, $H_{k2}$ and $H_{SO}$ may be in another direction including perpendicular to plane.

In the memory 300", the spin-orbit interaction switching is assisted by voltage controlled anisotropy. This may be made possible by using a nonmagnetic barrier layer in the magnetic junction 310''' that has a sufficiently large dielectric constant and a high RA. The perpendicular magnetic anisotropy may be sensitive to the voltage applied across the junction. In the embodiment shown, a control voltage, $V_{Control1}$, is applied across one magnetic junction 310". For a magnetic junction 310" having an in-plane easy axis, the control voltage increases the perpendicular magnetic anisotropy to $H_{k1}$. The increase in anisotropy perpendicular to the easy axis may allow the magnetic junction 310 to be switched. The magnetic junctions 310" that are not to be switched have a different voltage, $V_{Control2}$ (which may be zero) applied. As a result, such magnetic junctions 310''' have a reduced perpendicular anisotropy field of $H_{k2}$. Such magnetic junctions 310''' may not switch. In other embodiments, the magnetic junctions may have their easy axes perpendicular to plane. In such embodiments, application of the control voltage $V_{Control1}$ still results in an increase of the perpendicular anisotropy. However, the magnetic junction will not switch because the anisotropy along the easy axis has increased. In contrast, application of the control voltage, $V_{Control2}$ reduces the relative perpendicular anisotropy. As a result, such magnetic junctions 310''' have a lower anisotropy field of $H_{k2}$. The spin-orbit torque $H_{SO}$ is switches the magnetic moment of the free layer for the lower perpendicular anisotropy magnetic junctions 310". Thus, the magnetic memory 300" utilizes a voltage controlled anisotropy of the magnetic junction 310 to select the magnetic junction 310 to be written and uses spin-orbit torque as a primary switching mechanism.

The magnetic memory 300" shares the benefits of the magnetic memories 100, 100', 100", 100''', 200, 200', 200", 200''', 200'''', 250, 300 and/or 300'. Because the spin-orbit torque is used in switching the magnetic moment of the free layer, performance of the memory 300" may be improved. Further, the desired magnetic junction 310" to be programmed may be selected using voltage controlled anisotropies. Thus, performance of the memory 300' may be improved.

Figure 17:
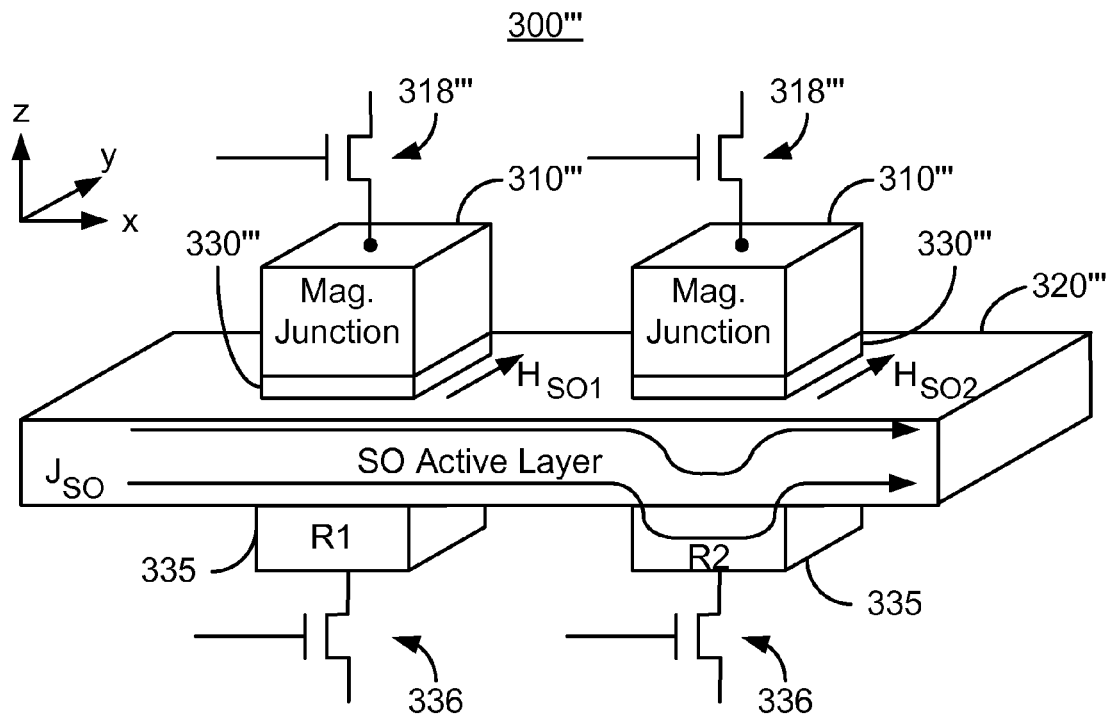
FIG. 17 depicts another exemplary embodiment of magnetic junctions switched using spin-orbit interaction.

FIG. 17 depicts an exemplary embodiment of a magnetic memory 300''' employing magnetic junctions 310''' switched primarily using spin-orbit interaction. For clarity, FIG. 17 is not to scale. The magnetic memory 300''' is analogous to the magnetic memories 100, 100', 100", 100''', 200, 200', 200", 200''', 200'''', 300, 300' and 300". Consequently, similar components have analogous labels. The magnetic memory 300''' thus includes magnetic junctions 310''', selection devices 318''', an optional spin diffusion insertion layer 330''', and a SO active layer 320''' that are analogous to the magnetic junctions, selection devices, spin diffusion insertion layers, and the SO active layers previously described. Although not shown, the magnetic junction 310''' includes a data storage/free layer, a nonmagnetic spacer layer, and a reference layer that are analogous to those previously described. Thus, the structure and function of the components 310''' and 320''' are analogous to that described above. Although the SO active layer 320''' is depicted as a word line, in other embodiments, other configurations may be used. The free layers of the magnetic junctions 310''' may each have an easy axis in plane or perpendicular to plane. Note that although $H_{SO1}$ and $H_{SO2}$ are both shown in the x-y plane, in another embodiment, the fields $H_{SO1}$ and $H_{SO2}$ may be in another direction including perpendicular to plane.

In the memory 300''', the spin-orbit interaction switching is assisted by resistance control. In the embodiment shown, the resistance of a resistor 335 is controlled through resistance selection transistors 336. Thus, the resistors 335 are variable resistive elements. The resistance R1 is a high resistance relative to the resistance of the SO active layer 320'''. Thus, current in the SO active layer 320" is not shunted through the resistor 335. As such, the spin-orbit torque generated $H_{SO1}$ is still sufficient to switch the magnetic element 310'''. For the resistor R2 that is lower relative to the SO active layer 320''', the spin-orbit current $J_{SO}$ is shunted through the resistor R2. The accumulation of charge carriers at the top surface of the layer 320''' is reduced. The spin-orbit field $H_{SO2}$ is also reduced. Thus, the spin-orbit field generated above R2 is not sufficient to write to the magnetic junction 310'''. Thus, the magnetic memory 300''' utilizes resistance changes for the magnetic junctions 310 to select the magnetic junction 310 to be written and uses spin-orbit torque as a primary switching mechanism.

The magnetic memory 300''' shares the benefits of the magnetic memories 100, 100', 100'', 100''', 200, 200', 200'', 200''', 200'''', 250, 300, 300', and 300''. Because the spin-orbit torque is used in switching the magnetic moment of the free layer, performance of the memory 300''' may be improved. Further, the desired magnetic junction 310'''' to be programmed may be selected using spin transfer torque. Thus, performance of the memory 300''' may be improved.

Figure 18:
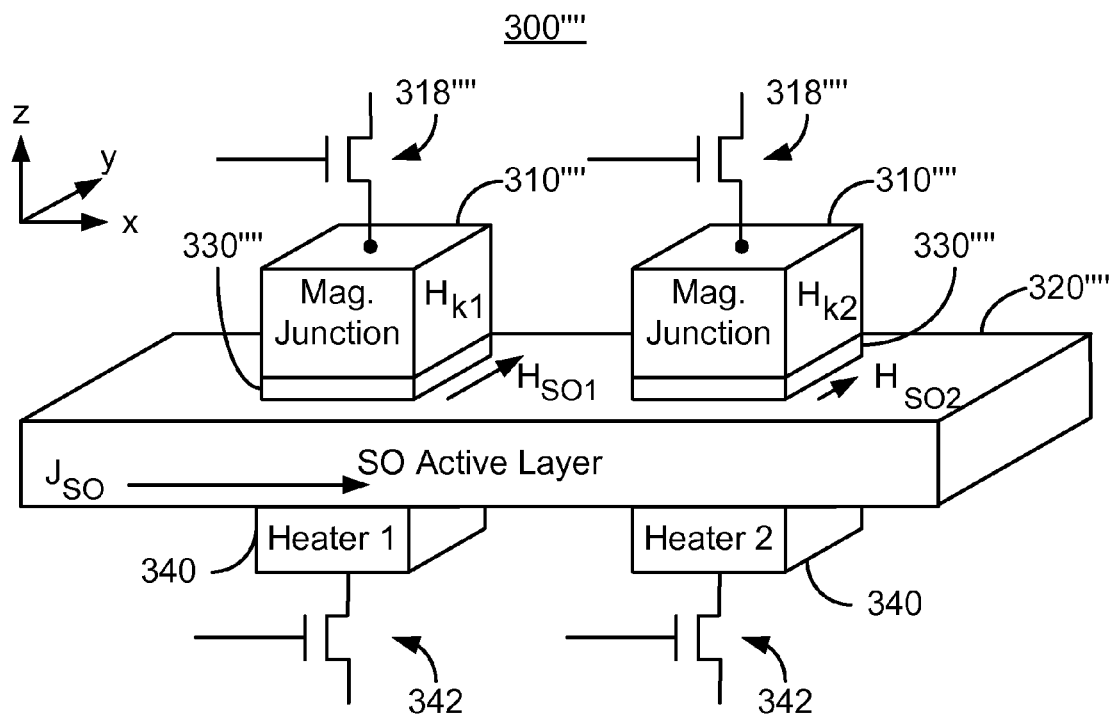
FIG. 18 depicts another exemplary embodiment of magnetic junctions switched using spin-orbit interaction.

FIG. 18 depicts an exemplary embodiment of a magnetic memory 300'''' employing magnetic junctions 310'''' switched primarily using spin-orbit interaction. For clarity, FIG. 18 is not to scale. The magnetic memory 300'''' is analogous to the magnetic memories 100, 100', 100'', 100''', 200, 200', 200'', 200''', 200'''', 250, 300, 300', 300'' and 300'''. Consequently, similar components have analogous labels. The magnetic memory 300'''' thus includes magnetic junctions 310'''', selection devices 318'''', an optional spin diffusion insertion layer 330'''', and a SO active layer 320'''' that are analogous to the magnetic junctions, selection devices, spin diffusion insertion layers, and the SO active layers previously described. Although not shown, the magnetic junction 310'''' includes a data storage/free layer, a nonmagnetic spacer layer, and a reference layer that are analogous to those previously described. Thus, the structure and function of the components 310'''' and 320'''' are analogous to that described above. Although the SO active layer 320'''' is depicted as a word line, in other embodiments, other configurations may be used. The free layers of the magnetic junctions 310'''' may each have an easy axis in plane or perpendicular to plane. Note that although $HH_{SO1}$ and $H_{SO2}$ are shown in the x-y plane, in another embodiment, the fields $H_{SO1}$ and $H_{SO2}$ may be in another direction including perpendicular to plane.

In the memory 300'''', the spin-orbit interaction switching is assisted by heating of the SO active layer 320'''' using heaters 340. The heaters 340 are controlled through heater selection transistors 342. When the heating element, such as heater 1, is quiescent, the SO active layer 320'''' may generate the desired spin-orbit field $H_{SO1}$ for switching the magnetic junction 310''''. However, the heater 2 may be driven. The SO active layer 320 is heated, which increases relaxation of the SO-induced spin accumulations and thus reduces the spin-orbit field $H_{SO2}$. The spin-orbit field generated is not sufficient to write to the magnetic junction 310''''. Thus, the magnetic memory 300'''' utilizes heating of the SO active layer 320'''' to select the magnetic junction 310'''' to be written and uses spin-orbit torque as a primary switching mechanism.

The magnetic memory 300'''' shares the benefits of the magnetic memories 100, 100', 100'', 100''', 200, 200', 200'', 200''', 200'''', 250, 300, 300', 300'' and 300'''. Because the spin-orbit torque is used in switching the magnetic moment of the free layer, performance of the memory 300'''' may be improved. Further, the desired magnetic junction 310'''' to be programmed may be selected using spin transfer torque. Thus, performance of the memory 300'''' may be improved.

Figure 19:
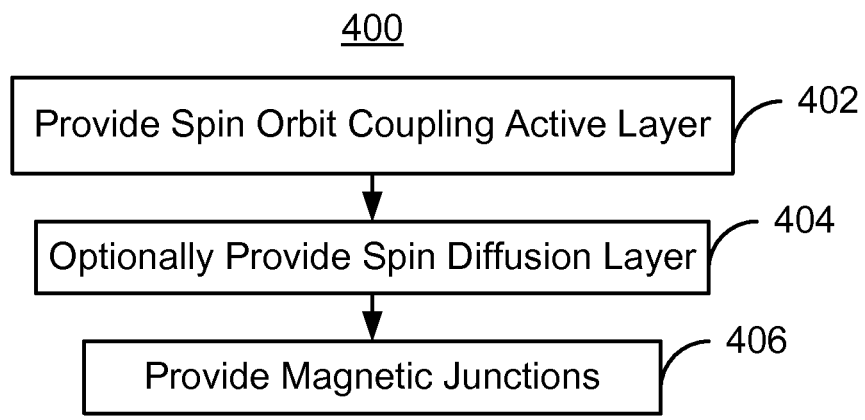
FIG. 19 is a flow chart depicting an exemplary embodiment of a method for providing magnetic junction(s) switched using spin-orbit interaction.

FIG. 19 is a flow chart depicting an exemplary embodiment of a method 400 for providing a magnetic memory having magnetic junction(s) switched using spin-orbit interaction. For simplicity, some steps may be omitted, combined, and/or interleaved. The method 400 is described in the context of the magnetic memory 100. However, the method 400 may be used to provide other magnetic memories including but not limited to the magnetic memories 100', 100'', 100''', 200, 200', 200'', 200''', 200'''', 250, 300, 300', 300'', 300''' and/or 300''''.

The SO active layer 120 is provided, via step 402. In some embodiments, step 402 includes providing a layer appropriate for the spin Hall effect. In other embodiments, a layer appropriate for the Rashba effect is provided. In still other embodiments, the SO active layer 120 provided may use a combination of the spin Hall effect and the Rashba effect. Other spin-orbit interaction mechanisms might also be provided. Step 402 may also include patterning the SO active layer. A spin diffusion layer (not shown in the magnetic memory 100) is optionally provided, via step 404. The spin diffusion layer, if provided, resides between the SO active layer 120 and the magnetic junctions 110.

The magnetic junctions 110 are provided, via step 406. In some embodiments, step 406 includes providing a free layer 112, a nonmagnetic layer such as a tunneling barrier layer 114 and a reference layer 116. Fabrication of the magnetic memory 100 may then be completed. Thus, using the method 400, the benefits of one or more of the magnetic memories 100, 100', 100'', 100''', 200, 200', 200'', 200''', 200'''', 250, 300, 300', 300'', and/or 300'''' may be achieved.

Figure 20:
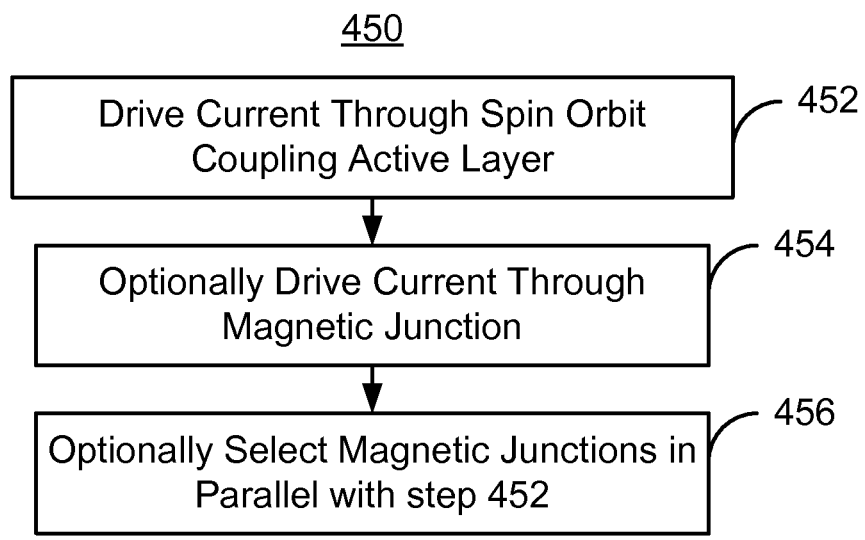
FIG. 20 is a flow chart depicting an exemplary embodiment of a method for programming magnetic junction(s) switched using spin-orbit interaction.

FIG. 20 is a flow chart depicting an exemplary embodiment of a method 450 for programming magnetic junction(s) switched using spin-orbit interaction. The method 450 may be used with one or more of the memories 100, 100', 100'', 100''', 200, 200', 200'', 200''', 200'''', 250, 300, 300', 300''', and/or 300''''. For simplicity, some steps may be omitted, combined, and/or interleaved. The method 450 is described in the context of the magnetic memory 100. However, the method 450 may be used with other magnetic junctions including but not limited to the magnetic memories 100, 100', 100'', 100''', 200, 200', 200'', 200''', 200'''', 250, 300, 300', 300''', and/or 300''''.

An in-plane spin-orbit write current is applied, via step 452. The spin-orbit write current may be applied as a pulse. The duration and rise of the pulse may be desired to be short, for example not more than 0.1-3 nanoseconds for spin-orbit interaction assisted switching. In other embodiments, other pulse durations may be used. In some embodiments, the duration of the pulse may be longer if spin-orbit interaction is the primary switching mechanism.

A spin transfer torque write current is optionally driven through the magnetic junction, via step 454. Step 454 is performed if spin-orbit interaction is used to assist in spin transfer torque writing. If spin-orbit interaction is used as the primary write mechanism, then step 454 might be omitted. The current in step 454 may also be applied as a pulse, as described above (e.g. with respect to FIG. 5). The current pulse applied in step 454 is desired to start after the pulse in step 452 has commenced. The current pulse may also start during the spin-orbit write current pulse, before the spin-orbit write current pulse or after the spin-orbit write current pulse has terminated. However, the spin transfer write current pulse is desired to start not later than the time for a few precessions of the magnetic moment of the free layer after termination of the spin-orbit interaction write pulse. Thus, the writing of the cells may be completed using steps 452 and 454.

In addition, the magnetic junctions 110 to be written may be selected, via step 456. For example, spin transfer torque, heating of the magnetic junction 110, voltage control of the magnetic anisotropy, resistance control over the SO active layer 120, heating of the SO active layer 120, some combination of the above and/or another mechanism may be used to select the cells to be written. Step 456 may also be performed at substantially the same time as step 452. Thus, the desired magnetic junctions 110 in the magnetic memory 100 may be programmed. Note that the magnetic junctions 110 may be read by driving a read current through the magnetic junctions 110 and determining whether the magnetic junctions 110 are in a high resistance state or a low resistance state.

Thus, using the method 450, the magnetic memories 100, 100', 100", 100'", 200, 200', 200", 200'", 200"", 250, 300, 300', 300", 300'" and/or 300"" may be programmed. Thus, the benefits of the magnetic memories 100, 100', 100", 100'", 200, 200', 200", 200'", 200"", 250, 300, 300', 300", 300'" and/or 300"" may be achieved.

A method and system for providing a magnetic junction and a memory fabricated using the magnetic junction has been described. Various combinations of features in the magnetic memories 100, 100', 100", 100'", 200, 200', 200", 200'", 200"", 250, 300, 300', 300", 300'" and/or 300"" may be combined. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic memory comprising:
a plurality of magnetic junctions, each of the plurality of magnetic junctions including a data storage layer, the data storage layer being magnetic; and
at least one spin-orbit interaction (SO) active layer adjacent to the data storage layer of the magnetic junction, the at least one SO active layer configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer, the at least one SO active layer also configured to exert no SO torque on the data storage layer in the absence of the current;
the data storage layer being configured to be switchable using at least the SO torque.

2. The magnetic memory of claim 1 wherein each of the plurality of magnetic junctions further includes a reference layer and a nonmagnetic spacer layer, the nonmagnetic spacer layer residing between the data storage layer and the reference layer, the data storage layer being a free layer.

3. The magnetic memory of claim 1 further comprising:
a spin diffusion insertion layer for each of the at least one SO active layer, the spin diffusion insertion layer being between the data storage layer and the at least one SO active layer.

4. A magnetic memory comprising:
a plurality of magnetic junctions, each of the plurality of magnetic junctions including a data storage layer, the data storage layer being magnetic; and
at least one spin-orbit interaction (SO) active layer adjacent to the data storage layer of the magnetic junction, the at least one SO active layer configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer;
a spin diffusion insertion layer for each of the at least one SO active layer, the spin diffusion insertion layer being between the data storage layer and the at least one SO active layer;
wherein the spin diffusion layer includes at least one of a metal layer, an insulating layer having a resistance area of less than $2\Omega\text{-}\mu m^2$, and a multilayer including a first layer and a second layer, the first layer including a first material, the second layer including a second material different from the first material; and
wherein the data storage layer is configured to be switchable using at least the SO torque.

5. The magnetic memory of claim 1 wherein the at least one SO active layer is selected from a first SO layer of A and a second SO layer of M doped by B, where A includes at least one of Y, Zr, Nb, Mo, Tc, Ru, Rh, Pd, Cd, In, Sb, Te, Hf, Ta, amorphous β-Ta, W, Re, Os, Ir, Pt, Au, Hg, Tl, Pb, Bi, Po, and At where M includes at least one of Al, Ti, V, Cr, Mn, Cu, Zn, Ag, Hf, Ta, W, Re, Pt, Au, Hg, Pb, Si, Ga, GaMn and GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, and Yb.

6. The magnetic memory of claim 1 wherein the at least one SO active layer includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, amorphous β-Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, and Yb.

7. The magnetic memory of claim 6 wherein the SO active layer adjoins the data storage layer, wherein the data storage layer includes at least one of Co, Fe, Ni, Mn, and wherein the magnetic junction includes an insulating layer adjoining the data storage layer, wherein the insulating layer adjoining the data storage layer includes at least one of an aluminum oxide and magnesium oxide.

8. The magnetic memory of claim 1 wherein the at least one SO active layer extends over at least two of the plurality of magnetic junctions.

9. The magnetic memory of claim 8 wherein the at least one SO active layer is an SO active word line.

10. A magnetic memory comprising:
a plurality of magnetic junctions, each of the plurality of magnetic junctions including a data storage layer, the data storage layer being magnetic; and
at least one spin-orbit interaction (SO) active layer adjacent to the data storage layer of the magnetic junction, the at least one SO active layer configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer;
the data storage layer being configured to be switchable using at least the SO torque;
wherein the at least one SO active layer is an SO active word line; and
wherein a portion of the SO active layer adjacent to each of the plurality of magnetic junctions has a first thickness and a first width, the SO active layer having a second thickness and a second width between two of the plurality of magnetic junctions, a first product of the first thickness and the first width being less than a second product of the second width and the second thickness.

11. The magnetic memory of claim 1 further comprising:
at least one word line corresponding to the plurality of magnetic junctions, the at least one SO active layer residing between the data storage layer and the at least one word line.

12. The magnetic memory of claim 11 wherein the at least one word line includes at least one aperture corresponding to each of the at least one SO active layer.

13. A magnetic memory comprising:
a plurality of magnetic junctions, each of the plurality of magnetic junctions including a data storage layer, the data storage layer being magnetic; and
at least one spin-orbit interaction (SO) active layer adjacent to the data storage layer of the magnetic junction, the at least one SO active layer configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer, the at least one SO active layer further including
at least one spin polarized current injector for polarizing a plurality of spins of a plurality of charge carriers for the current; and
at least one conductive layer having a high spin diffusion length, the at least one conductive layer being between the at least one spin polarized current injector and the plurality of magnetic junctions; and
wherein the data storage layer is configured to be switchable using at least the SO torque.

14. The magnetic memory of claim 13 wherein the spin diffusion length is at least 100 nm.

15. The magnetic memory of claim 14 wherein the spin diffusion length is at least one micron.

16. The magnetic memory of claim 1 wherein the data storage layer is further configured to be switchable using a write current passed through the magnetic junction.

17. The magnetic memory of claim 16 wherein the data storage layer has a quiescent magnetic moment in a first direction and the at least one SO active layer generates a SO polarization in a second direction substantially perpendicular to the first direction.

18. The magnetic memory of claim 17 wherein the magnetic moment of the data storage layer is substantially perpendicular to plane.

19. The magnetic memory of claim 16 wherein the current through the at least one SO active layer is a first current pulse, the write current is a second current pulse, and wherein the first current pulse does not start after the second current pulse.

20. The magnetic memory of claim 1 wherein the at least one SO active layer includes at least one of Z, or at least one surface alloy of A/B residing on a (111) surface of a host material B, or material Q, or a combination thereof, A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, and Yb, and B includes at least one of Si, Zn, Cu, Ag, Au, W, Zn, Cr, Pt, Pd; alloys A/B include substitutional Bi/Ag, substitutional Pb/Ag, substitutional Sb/Ag, substitutional Bi/Si, substitutional Ag/Pt, substitutional Pb/Ge, substitutional Bi/Cu, Z includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, Q includes at least one of InGaAs, HgCdTe, a $LaAlO_3/SrTiO_3$ bilayer, and $LaTiO_3/SrTiO_3$ bilayer.

21. The magnetic memory of claim 1 wherein the data storage layer has an easy axis and the at least one SO active layer generates a SO field having a polarization along the easy axis.

22. The magnetic memory of claim 21 wherein the data storage layer is configured to be switched if the SO field and a spin transfer field are aligned.

23. The magnetic memory of claim 21 wherein the data storage layer is configured to be switched by the SO field and a heating current driven through the data storage layer.

24. The magnetic memory of claim 21 wherein the data storage layer is configured to be switched by the SO field and an anisotropy control voltage applied to data storage layer, the anisotropy control voltage configured to change a magnetic anisotropy of the data storage layer.

25. A magnetic memory comprising:
a plurality of magnetic junctions, each of the plurality of magnetic junctions including a data storage layer, the data storage layer being magnetic; and
at least one spin-orbit interaction (SO) active layer adjacent to the data storage layer of the magnetic junction, the at least one SO active layer configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer;
a plurality of variable resistive elements corresponding to the plurality of magnetic elements and being adjacent to the at least one SO active layer, each of the plurality of variable resistive elements configured to have a low resistance state and shunt the current from the at least one SO active layer in a first region corresponding to at least one magnetic element of the plurality of magnetic elements that is not to be written, each of the plurality of variable resistive elements configured to have a high resistance state in a second region corresponding to at least another magnetic element of the plurality of magnetic elements that is to be written, the at least one SO active layer generating the SO field in the second region;
wherein the data storage layer is configured to be switchable using at least the SO torque; and
wherein the data storage layer has an easy axis and the at least one SO active layer generates a SO field having a polarization along the easy axis.

26. The magnetic memory of claim 21 further comprising:
a plurality of heating elements corresponding to the plurality of magnetic elements and being adjacent to the at least one SO active layer, each of the plurality of heating elements configured to heat the at least one SO active layer in a region corresponding to at least one magnetic element of the plurality of magnetic elements that is not to be written, the at least one SO active layer generating the SO field at a portion of the plurality of heating elements that is not heating the at least one SO active layer.

27. A magnetic memory comprising:
a plurality of storage cells, each of the plurality of magnetic storage cells including at least one selection device and at least one magnetic junction, each of the at least one magnetic junction including a reference layer, a nonmagnetic spacer layer, and a free layer, the free layer being magnetic, the nonmagnetic spacer layer being between the reference layer and the free layer; and
at least one spin-orbit interaction (SO) active layer adjacent to the free layer of the magnetic junction, the at least one SO active layer configured to exert a SO torque on the free layer due to an in-plane current passing through the at least one SO active layer, the at least one SO active layer also configured to exert no SO torque on the free storage layer in the absence of the in-plane current;

the free layer being configured to be switchable using the SO torque and a perpendicular write current driven through the at least one magnetic junction.

28. A magnetic memory comprising:
a plurality of storage cells, each of the plurality of magnetic storage cells including at least one selection device and at least one magnetic junction, each of the at least one magnetic junction including a reference layer, a non-magnetic spacer layer, and a free layer, the free layer being magnetic, the nonmagnetic spacer layer being between the reference layer and the free layer; and
at least one spin-orbit interaction (SO) active layer adjacent to the free layer of the magnetic junction, the at least one SO active layer configured to exert a SO torque on the free layer due to an in-plane current passing through the at least one SO active layer, the at least one SO active layer also configured to exert no SO torque on the free layer in the absence of the in-plane current;
the free layer being configured to be switchable using the SO torque.

29. A method for providing a magnetic memory comprising:
providing a plurality of magnetic junctions, each of the plurality of magnetic junctions including a data storage layer, the data storage layer being magnetic; and
providing at least one spin-orbit interaction (SO) active layer adjacent to the data storage layer of the magnetic junction, the at least one SO active layer configured to exert a SO torque on the free layer due to a current passing through the at least one SO active layer in a direction substantially perpendicular to a direction between the at least one SO active layer and the data storage layer of a magnetic junction of the plurality of magnetic junctions closest to the at least one SO active layer, the at least one SO active layer configured to exert no SO torque on the data storage layer in the absence of the current;
the data storage layer being configured to be switchable using at least the SO torque.

30. The method of claim 29 wherein each of the plurality of magnetic junctions further includes a reference layer and a nonmagnetic spacer layer, the nonmagnetic spacer layer residing between the data storage layer and the reference layer, the data storage layer being a free layer.

31. The method of claim 29 further comprising:
providing a spin diffusion insertion layer for each of the at least one SO active layer, the spin diffusion insertion layer being between the data storage layer and the at least one SO active layer.

32. The method of claim 29 wherein the at least one SO active layer extends over at least two of the plurality of magnetic junctions.

33. The method of claim 29 further comprising:
providing at least one word line corresponding to the plurality of magnetic junctions, the at least one SO active layer residing between the data storage layer and the at least one word line.

34. The method of claim 33 wherein the at least one word line includes at least one aperture corresponding to each of the at least on SO active layer.

35. A method for providing a magnetic memory comprising:
providing a plurality of magnetic junctions, each of the plurality of magnetic junctions including a data storage layer, the data storage layer being magnetic; and
providing at least one spin-orbit interaction (SO) active layer adjacent to the data storage layer of the magnetic junction, the at least one SO active layer configured to exert a SO torque on the free layer due to a current passing through the at least one SO active layer in a direction substantially perpendicular to a direction between the at least one SO active layer and the data storage layer of a magnetic junction of the plurality of magnetic junctions closest to the at least one SO active layer, the step of providing the SO active layer further including
providing at least one spin polarized current injector for polarizing a plurality of spins of a plurality of charge carriers for the current; and
providing at least one conductive layer having a high spin diffusion length, the at least one conductive layer being between the at least one spin polarized current injector and the plurality of magnetic junctions; and
wherein the data storage layer is configured to be switchable using at least the SO torque.

36. The method of claim 29 wherein the data storage layer is further configured to be switchable using a write current passed through the magnetic junction.

37. The method of claim 36 wherein the data storage layer has a magnetic moment in a first direction and the at least one SO active layer generates a SO field in a second direction substantially perpendicular to the first direction.

38. The method of claim 37 wherein the magnetic moment of the data storage layer is substantially perpendicular to plane.

39. The method of claim 37 wherein the current through the at least one SO active layer is a first current pulse, the write current is a second current pulse, and wherein the first current pulse starts before the second current pulse.

40. The method of claim 29 wherein the data storage layer has an easy axis and the at least one SO active layer generates a SO field in along the easy axis.

41. A method for programming a magnetic memory including a plurality of magnetic junctions, each of the plurality of magnetic junctions including a data storage layer, the data storage layer being magnetic the method comprising:
driving a current through at least one spin-orbit interaction (SO) active layer adjacent to the data storage layer of the magnetic junction, the at least one SO active layer configured to exert a SO torque on the free layer due to a current passing through the at least one SO active layer in a direction substantially perpendicular to a direction between the at least one SO active layer and the data storage layer of a magnetic junction of the plurality of magnetic junctions closest to the at least one SO active layer, the data storage layer being configured to be switchable using at least the SO torque;
wherein the SO active layer is configured to exert no SO torque on the data storage layer in the absence of the current.

42. The method of claim 40 wherein the step of driving the current through the at least one SO active layer includes driving a first current pulse through the at least one SO active layer and wherein the method further includes:
driving a second current pulse through a portion of the at least one magnetic junction after the first current pulse starts.

43. The method of claim 40 further comprising:
selecting at least one of the plurality of magnetic junctions for writing.

* * * * *